United States Patent [19]

Kidoguchi et al.

[11] Patent Number: 5,502,739

[45] Date of Patent: Mar. 26, 1996

[54] SEMICONDUCTOR LASER DEVICE

[75] Inventors: Isao Kidoguchi, Mino; Kiyoshi Ohnaka, Moriguchi; Hideto Adachi, Mino; Satoshi Kamiyama, Sanda; Masaya Mannou, Hirakata; Takeshi Uenoyama, Kyoto, all of Japan

[73] Assignee: Matsushita Electric Industrial Co., Ltd., Osaka, Japan

[21] Appl. No.: 396,506

[22] Filed: Mar. 1, 1995

Related U.S. Application Data

[62] Division of Ser. No. 223,215, Apr. 5, 1994.

[30] Foreign Application Priority Data

| Apr. 5, 1993 | [JP] | Japan | 5-77845 |
| Apr. 5, 1993 | [JP] | Japan | 5-77854 |
| Jul. 28, 1993 | [JP] | Japan | 5-186022 |
| Aug. 6, 1993 | [JP] | Japan | 5-195859 |

[51] Int. Cl.⁶ .................................................. H01S 3/19
[52] U.S. Cl. ......................................... 372/45; 372/46
[58] Field of Search ........................................... 372/45, 46

[56] References Cited

U.S. PATENT DOCUMENTS

| 4,794,611 | 12/1988 | Hara et al. | 372/45 |
| 4,839,899 | 6/1989 | Burnham et al. | 372/45 |
| 4,999,844 | 3/1991 | Imamoto . | |
| 5,272,712 | 12/1993 | Arimoto et al. | 372/45 |
| 5,362,974 | 11/1994 | Irikawa et al. | 372/45 |

FOREIGN PATENT DOCUMENTS

| 4-218994 | 8/1992 | Japan . |
| 4-273491 | 9/1992 | Japan . |
| 5-3367 | 1/1993 | Japan . |
| 5-175605 | 7/1993 | Japan . |

OTHER PUBLICATIONS

T. Takagi, et al., "Potential Barrier Height Analysis of AlGaInP Multi-Quantum Barrier (MQB)", *Japanese Journal of Applied Physics*, vol. 29, No. 11, pp. L 1977-L 1980 (Nov. 1990).

T. Takagi et al., "Design and Photoluminescence Study on a Multiquantum Barrier", *IEEE Journal of Quantum Electronics*, vol. 27, No. 6, pp. 1511–1519 (Jun. 1991).

T. Takagi et al., "Photoluminescence Study of Electron Wave Confinement in Multi-Quantum Barrier (MQB)", *Japanese Journal of Applied Physics*, vol. 29, No. 11, pp. L 1969–L 1972 (Nov. 1990).

*Primary Examiner*—Rodney B. Bovernick
*Assistant Examiner*—Yisun Song
*Attorney, Agent, or Firm*—Ratner & Prestia

[57] ABSTRACT

A semiconductor laser device having an active layer, a pair of cladding layers interposing the active layer and a multi-quantum barrier provided between one of the pair of cladding layers and the active layer is provided. The multi-quantum barrier includes barrier layers and well layers being alternated with each other. Thickness, energy band gap, or impurity concentration of at least one of the barrier layers and well layers in the multi-quantum barrier changes with the distance from the active layer, thereby providing a stable function of reflecting carriers overflowing from the active layer back to the active layer.

5 Claims, 24 Drawing Sheets

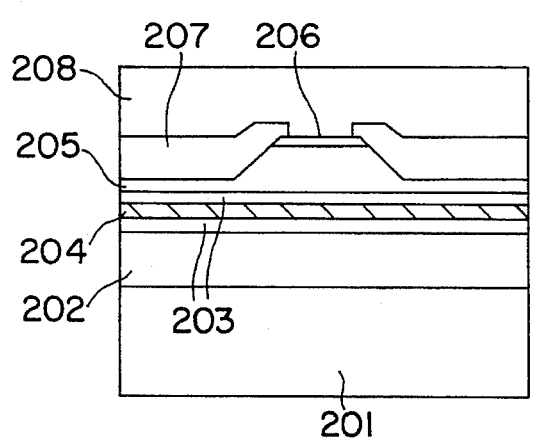
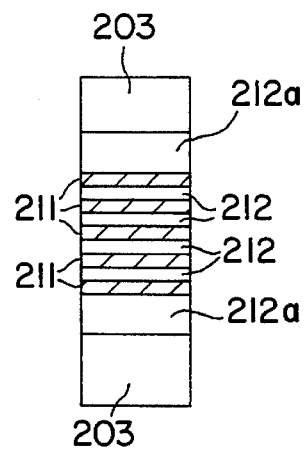
FIG. 21A    FIG. 21B
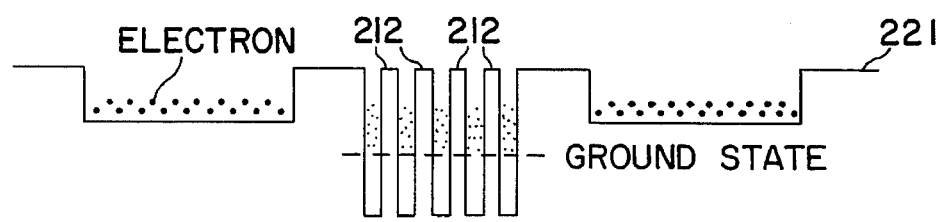
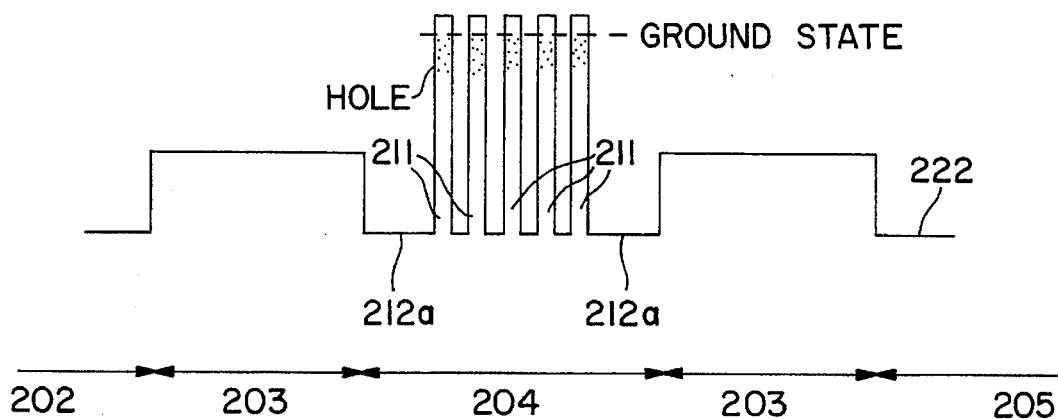
FIG. 22

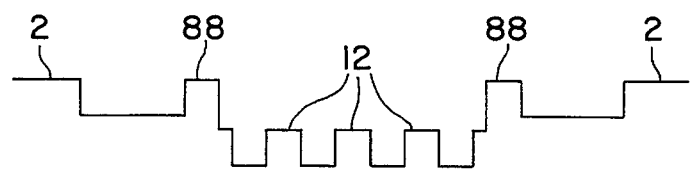
FIG. 40A
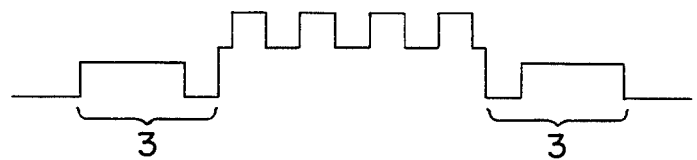
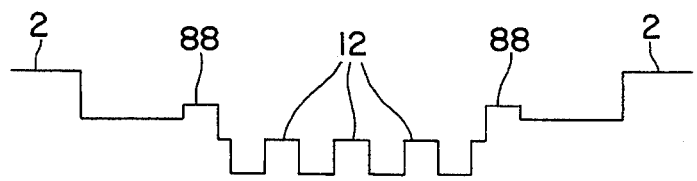
FIG. 40B
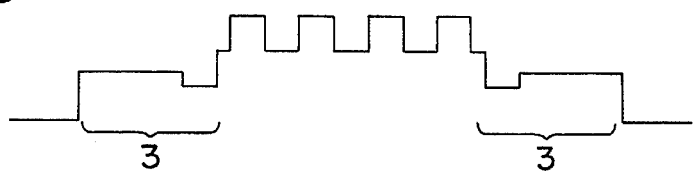
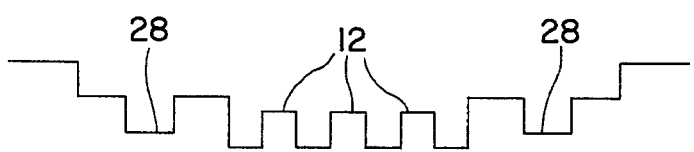
FIG. 40C
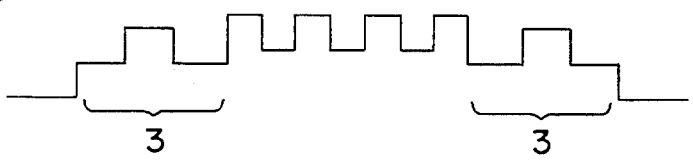
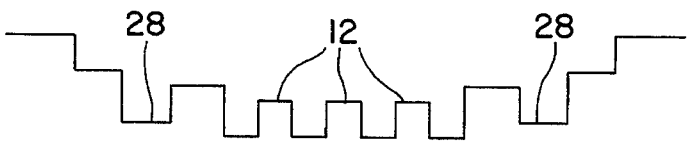
FIG. 40D
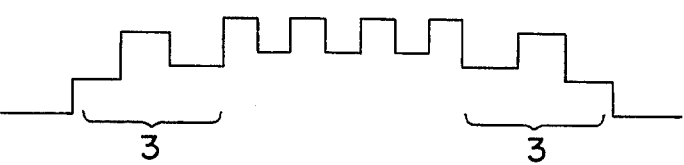

SEMICONDUCTOR LASER DEVICE

This application is a division of application Ser. No. 08/223,215, filed Apr. 5, 1994, (status: pending)"

BACKGROUND OF THE INVENTION

1. Field of the Invention:

The present invention relates to a semiconductor laser device used in such fields as optical communication and optical information processing.

2. Description of the Related Art:

Semiconductor lasers which are capable of emitting laser light having wavelengths in the visible region have such applications as a light source for optical information processing and a light source for optical measurement, and have been gaining importance recently. And much effort has been made to develop various semiconductor materials suitable for such semiconductor laser devices. Among all possibilities, materials based on $(Al_xGa_{1-x})_{0.5}In_{0.5}P$ have become a focus of attention because they are capable of lattice matching with GaAs which makes a good substrate, and are capable of generating laser light in a wavelength band from 0.68 μm to 0.58 μm by changing the Al mole fraction x. The wavelength of the laser light can be shortened by simply increasing the Al mole fraction in the active layer of the semiconductor laser device.

A transverse mode control type semiconductor laser device (for the emission of red light) will be described below with reference to FIG. 16.

The semiconductor laser device has an n-GaAs substrate 1 and a multi-layered structure formed on the substrate 1 as shown in FIG. 16. The multi-layered structure includes an n-GaAs buffer layer 2 formed on the top surface of the substrate 1, an n-$(Al_{0.6}Ga_{0.4})_{0.51}In_{0.49}P$ cladding layer 3, a $(Al_{0.15}Ga_{0.85})_{0.51}In_{0.49}P$ active layer 4, a p-$(Al_{0.6}Ga_{0.4})_{0.51}In_{0.49}P$ cladding layer 5, a p-$Ga_{0.51}In_{0.49}P$ layer 7, an n-GaAs current block layer 8 and a p-GaAs cap layer 9. Bottom surface of the substrate 1 and top surface of the cap layer 9 are provided with an n-electrode 10 and a p-electrode 11, respectively.

Such a semiconductor laser device is capable of confining the current within a relatively narrow area by means of the n-GaAs current block layer 8. When etching the p-$(Al_{0.6}Ga_{0.4})_{0.51}In_{0.49}P$ cladding layer 5 in the form of a trapezoid during the manufacturing process, an effective refractive index difference which satisfies the conditions for single transverse mode emission can be easily provided by optimizing the height and width of the trapezoid. As a result, it is made possible to confine the light effectively within the narrow area of the active layer 4 at the base of the trapezoid.

However, when the amount of Al added to the active layer is increased, namely value of the Al mole fraction x is increased for the purpose of obtaining shorter wavelength of the laser emission, a difference ΔEg in energy band gaps between the $(Al_{0.6}Ga_{0.4})_{0.51}In_{0.49}P$ cladding layer and the active layer decreases. As a result, carriers injected into the active layer 4 for the laser emission can easily cross the barrier between the cladding layer 3, 5 and the active layer 4, thereby to reach the cladding layer 3, 5. This phenomenon is generally called a carrier overflow. The carrier overflow increases the number of carriers which do not contribute to the laser emission and deteriorates the characteristic of the semiconductor laser device. More specifically, the threshold current for laser emission increases to make laser emission at high temperatures difficult. The carrier overflow is more conspicuous, among the carriers, with electrons having less effective mass.

A semiconductor laser device has a limitation in emitting at shorter wavelengths, due to the restriction by the carrier overflow as described above. Continuous wave (CW) laser emission is limited to wavelengths not shorter than about 630 nm. Characteristics of semiconductor laser devices (wavelength: 630 nm) are not satisfactory, since a maximum cw operation temperature is about 40° C. and maximum optical output power is as low as about 3 mW.

For the purpose of suppressing the electron overflow described above, a structure called a multi-quantum barrier (MQB) has been proposed (for example, the Japanese Journal of Applied Physics 29 (1990) pp. L1977–L1980). A prior art semiconductor laser device having a multi-quantum barrier will be described below with reference to FIG. 17 and FIG. 18. The semiconductor,laser device has a multi-quantum barrier 13 comprising a p-$(Al_{0.6}Ga_{0.4})_{0.51}In_{0.49}P$ barrier layer 20 having a relatively broad band gap with 6-atom thickness (17 angstroms) and a $(Al_{0.15}Ga_{0.85})_{0.51}In_{0.49}P$ layer 21 having a relatively narrow band gap with 4-atom thickness (11.5 angstroms) ten times on one another between a p-$(Al_{0.6}Ga_{0.4})_{0.51}In_{0.49}P$ cladding layer 5 and a $(Al_{0.15}Ga_{0.85})_{0.51}In_{0.49}P$ active layer 4. Except for the multi-quantum barrier 13, the structure of this semiconductor laser device is similar to that of the semiconductor laser device shown in FIG. 16.

The multi-quantum barrier 13 is provided in order to reflect electrons (electron waves) toward the active layer 4 thereby to suppress the electron overflow. FIG. 19 shows the change in the electron-wave reflectivity with the electron energy in this laser device. Electrons encounter a barrier about twice higher than in a conventional laser device having no multi-quantum barrier. Because the electron overflow can be suppressed, a low threshold current and high temperature stability can be attained.

However, when one layer has a thickness deviation of a magnitude of a 2-atom layer or greater among the ten p-$(Al_{0.6}Ga_{0.4})_{0.51}In_{0.49}P$ barrier layer 20 of the multi-quantum barrier layer 13, the electron-wave reflectivity lowers at a position where the electron has a certain low energy. FIG. 20 shows the change of electron-wave reflectivity with the electron energy when the thickness of the sixth p-$(Al_{0.6}Ga_{0.4})_{0.51}In_{0.49}P$ barrier layer 20 decreases by the thickness of a 2-atom layer (5.66 angstroms). There is a drop in the reflectivity at an energy of 101 meV. A barrier height for the electron is determined by the minimum energy of electrons which can pass the barrier. Thus the barrier loses its barrier effect on the electrons when the thickness changes by the thickness of at least 2-atom layer. As a result, it becomes difficult to obtain a semiconductor laser device having good characteristics.

In the semiconductor laser device of the prior art described above, AlGaInP mixed crystal which includes aluminum (Al) is used as the material of the active layer in order to obtain shorter wavelength laser emission. However, because aluminum has a strong tendency of oxidation, increasing the amount of aluminum induces crystal defects leading to a gross decrease in the laser emission efficiency. Use of a multi-quantum well structure for the active layer eliminates such a problem, because the quality can be stabilized and emission at a short wavelength can be obtained even When GaInP which can be manufactured easily is used.

A multi-quantum well (MQW) laser of the prior art operating in 630 nm band will be described below.

FIG. 26A shows the energy band diagram of a typical multi-quantum well laser operating in 630 nm band, and FIG. 26B shows the energy band diagram of a separate confinement type multi-quantum well (SCH-MQW) laser. In the example of FIG. 26A, a multi-quantum well layer 234 made by laminating well layers 241 and barrier layers 242 alternately is interposed between a first cladding layer 232 and a second cladding layer 235. In the example of FIG. 26B, an optical guide layer 233 is further provided between the multi-quantum well layer 234 and the cladding layers 232 and 235.

In either example, ground level 236 of electron is set higher in the energy level than the edge of the conduction band, and the ground level 237 of hole is set higher in the energy level than the edge of the valence band. The differences ($\Delta EC$, $\Delta EV$) in the energy level between the ground levels 236, 237 and the band edges of the cladding layers 232, 235 are especially small with respect to the conduction band. This means that confinement of the carriers (electrons in particular) within the active layer is weak, resulting in leakage current due to massive diffusion of electrons into the p-cladding layer. That is, electrons supplied from the n-cladding layer cannot be sufficiently confined within the quantum well layer 241 leading to an overflow from the quantum well layer 241 to diffuse in the form of 3-dimensional.

Therefore such problems occur as electrons which do not contribute to the laser emission increase, threshold current for the laser emission increases or the threshold current heavily depends on the temperature. Although both examples of FIG. 26A and 26B have the problems roughly described above, the example of FIG. 26B has the optical guide layer 233, unlike the example of FIG. 26A, wherein light is confined. This makes it possible for the light emitted in the quantum well to effectively contribute to the stimulated emission, thereby reducing the threshold current of the laser. The leakage current described above can also be reduced, because the carrier density during laser emission is decreased.

However, even with the separate confinement type multi-quantum well structure (SCH structure) shown in FIG. 26B, the threshold current is still higher and the stability against temperature change is lower than in the case of other semiconductor laser devices. Thus reliability of the device is low and its application is limited. This is because of the significant leakage current due to the use of materials having relatively broad energy gap, and that the potential barrier of the quantum well (difference in the energy level between the ground level and the conduction band of the barrier layer) which leads to insufficient quantum effect.

FIG. 27 shows 2-dimensional state density of electron in the separate confinement type multi-quantum well structure wherein a multi-quantum well layer having well width of 3 nm, barrier width 5 nm and five wells is interposed between optical guide layers of thickness 65 nm. This figure shows that the state density changes with the energy in fine stair steps, because electrons cannot be completely confined within the wells so that electron wave packets are coupled with each other in the multi-quantum well layer. The figure shows that the state density shows a steep increase in the energy region beyond about 0.114 eV. This energy level corresponds just to the height of the potential barrier, indicating that electrons having energies beyond the barrier cannot be confined within the wells.

Consequently, no significant quantum effect can be obtained in this region because electrons overflow from the quantum well 241 as shown in FIG. 26B, (causing the emission efficiency to decrease. In this structure, because the quasi Fermi level during laser emission exceeds 0.1 eV, a fairly large number of electrons can exist in this region while only the electrons around the ground level can contribute to the laser emission, thus the high-energy electrons become ineffective.

These high-energy electrons recombine with holes to cause ineffective current and increase the threshold current of the laser.

Due to the mechanism described above, only unsatisfactory characteristics have been obtained from the separate confinement type multi-quantum well laser of the prior art operating at short wavelengths. Also in a semiconductor laser device operating at a long wavelength such as that based on InGaAsP/InP, for example, as well as in short wavelength lasers, population of electrons in the optical guide layer increases as the width of quantum well becomes very small, thereby decreasing the efficiency of the laser similarly to the cases described above. A single quantum well semiconductor laser device having only one well layer also has problems similar to those described above.

SUMMARY OF THE INVENTION

The semiconductor laser device of this invention includes an active layer, a pair of cladding layers interposing the active layer and a multi-quantum barrier provided between one of the pair of cladding layers and the active layer; wherein the multi-quantum barrier includes a structure comprising barrier layers and well layers having an energy band gap narrower than that of the barrier layers being alternated with each other, thereby providing a function of reflecting carriers overflowing from the active layer back to the active layer, and a thickness of at least one of the barrier layers and well layers in the multi-quantum barrier changes with the distance from the active layer.

In one embodiment, a thickness of at least one of the barrier layers and well layers in at least a part of the multi-quantum barrier decreases monotonously with the distance from the active layer.

In one embodiment, a thickness of at least one of the barrier layers and well layers in at least a part of the multi-quantum barrier increases monotonously with the distance from the active layer.

The semiconductor laser device of the invention includes an active layer, a pair of cladding layers interposing the active layer and a multi-quantum barrier provided between one of the pair of cladding layers and the active layer; wherein the multi-quantum barrier includes a structure comprising barrier layers and well layers having an energy band gap narrower than that of the barrier layers being alternated with each other, thereby providing a function of reflecting carriers overflowing from the active layer back to the active layer, and an energy band gap of at least one of the barrier layers and well layers in the multi-quantum barrier changes with the distance from the active layer.

In one embodiment, a thickness of at least one of the barrier layers and well layers in at least a part of the multi-quantum barrier decreases monotonously with the distance from the active layer.

In one embodiment, a thickness of at least one of the barrier layers and well layers in at least a part of the multi-quantum barrier increases monotonously with the distance from the active layer.

The semiconductor laser device of the invention includes an active layer, a pair of cladding layers interposing the active layer and a multi-quantum barrier provided between one of the pair of cladding layers and the active layer; wherein the multi-quantum barrier includes a structure comprising barrier layers and well layers having an energy band gap narrower than that of the barrier layers being alternated wit, h each other, thereby providing a function of reflecting carriers overflowing from the active layer back to the active layer, an energy difference between a conduction band of the barrier layers and that of the well layers is greater than 100 meV, and a tensile stress is applied to the barrier layers in a direction parallel to the barrier layers.

The semiconductor laser device of the invention includes an active layer, a pair of cladding layers interposing the active layer and a multi-quantum barrier provided between one of the pair of cladding layers and the active layer; wherein the multi-quantum barrier includes a structure comprising barrier layers and well layers having an energy band gap narrower than that of the barrier layers being alternated with each other, thereby providing a function of reflecting carriers overflowing from the active layer back to the active layer, an energy difference between a conduction band of the barrier layers and that of the well layers is greater than 100 meV, and a compressive stress is applied to the well layers in a direction parallel to the well layers.

In one embodiment, compressive stress is applied to the well layer in a direction parallel to the well layers.

In one embodiment, an absolute value $\delta 1$ of stress applied to the barrier layer, a thickness $d1$ of the barrier layer, a stress $\delta 2$ applied to the well layer and a thickness $d2$ of the well layer satisfy the relationship $\delta 1 \times d1 = \delta 2 \times d2$.

The semiconductor laser device of the present invention includes an active layer, a pair of cladding layers interposing the active layer and a multi-quantum barrier provided between one of the pair of cladding layers and the active layer; wherein the multi-quantum barrier includes a structure comprising barrier layers and well layers having an energy band gap narrower than that of the barrier layers being alternated with each other, thereby providing a function of reflecting carriers overflowing from the active layer back to the active layer, and a carrier concentration in the barrier layers is higher than that in the well layer.

In one embodiment, impurities are not substantially doped into the well layers.

The semiconductor laser device of the invention includes: a quantum well layer including a well layer and a barrier layer for light emission; an optical guide layer for confining the light generated in the quantum well layer within the quantum well layer; and an electron distribution control layer provided between the optical guide layer and the quantum well layer, wherein the optical guide layer is thicker than the quantum well layer, and energy band gaps of the electron distribution control layer and the barrier layer are greater than an energy band gap of the optical guide layer, thereby electron distributions in the optical guide layer and in the quantum well layer are controlled.

In one embodiment, the electron distribution control layer is thicker than the de Broglie wavelength of electron.

In one embodiment, the quantum well layer has a single quantum well structure.

In one embodiment, the quantum well layer has a multi-quantum well structure.

The semiconductor laser device of the invention includes: a quantum well layer including a well layer and a barrier layer for light emission; and an optical guide layer to confine light generated in the quantum well layer within the quantum well layer, wherein the optical guide layer includes an electron distribution control layer Which has an energy band gap of a magnitude different from an energy band gap of the optical guide layer and thereby controls the distribution of electrons in the optical guide layer and the quantum well layer.

In one embodiment, the electron distribution control layer includes a high barrier layer which has energy band gap greater than an energy band gap of the optical guide layer.

In one embodiment, the electron distribution control layer includes a low barrier layer which has energy band gap smaller than an energy band gap of the optical guide layer.

In one embodiment, a thickness of the high barrier section is greater than the de Broglie wavelength of electron.

In one embodiment, a thickness of the low barrier section is greater than the de Broglie wavelength of electron.

In one embodiment, a thickness of the optical guide layer except for the electron distribution control layer is greater than a thickness of the quantum well layer.

In one embodiment, a thickness of the optical guide layer is greater than a thickness of the quantum well layer.

In one embodiment, a thickness of the low barrier section of the electron distribution control layer is greater than the thickness of the quantum well layer.

According to one aspect of the invention, a multi-quantum barrier reflects electrons which have leaked from the active layer toward the active layer, and thereby functions as a barrier which suppresses the electron overflow. It was found that, by making the multi-quantum barrier in a constitution as described in the claim, the function as a barrier which reflects electrons toward the active layer and thereby suppresses the overflow of the electrons can be maintained unchanged, even when the thickness of the semiconductor layers constituting the multi-quantum barrier is changed by the thickness of a 2-atom layer or more. As a result of the overflow of electrons being suppressed, a semiconductor laser device having a low threshold current and less dependence on the temperature is provided.

According to another aspect of the invention, when tensile stress in the direction parallel to the layer is applied to the barrier layers which constitute the multi-quantum barrier, the difference between the energy band gap of the barrier layer and the energy band gap of the well layer can be increased. Therefore the function as a barrier Which reflects electrons toward the active layer and thereby suppresses the overflow of the electrons can be maintained unchanged, even when the thickness of the semiconductor layers constituting the multi-quantum barrier is changed by the thickness of a 2-atom layer or more. Also a barrier higher than the multi-quantum barrier of the prior art can be obtained. Further the efficiency of hole injection into the active layer can be made higher than in the case of multi-quantum barrier of the prior art. As a result of these features, semiconductor laser devices having uniform characteristics, low threshold current and high temperature stability can be provided with high reproducibility.

In particular, occurrence of such defects as dislocation in the multi-quantum barrier can be suppressed when the absolute value $\delta 1$ of the stress generated in the barrier constituted of the multi-quantum barrier, thickness $d1$ of the barrier layer, stress $\delta 2$ generated in the well1 layer and thickness $d2$ of the well layer satisfy the following relationship:

$$\delta 1 \times d1 = \delta 2 \times d2.$$

According to further another aspect of the invention, electrons can be confined within the quantum well layer by forming out-barrier layers outside the multi-quantum wells and forming optical guide layers having narrow band gap than the out-barrier layer further outside thereof. Because this constitution increases the effect of confining electrons and holes within the multi-quantum wells, leak current and ineffective recombination current in the guide layer decrease and eventually a short wavelength semiconductor laser device having a low threshold current can be obtained. Because the energy band gap in the barrier layer of the multi-quantum wells can be decreased to increase the refractive index in this portion, strong confinement of light and high state density of electron can be obtained, and it is made possible that only the electrons near the edge of the band contribute to the recombination for emission. Therefore, leak current and ineffective recombination current in the guide layer can be decreased and, at the same time, the effect of light confinement is increased, thereby a short wavelength semiconductor laser device having a low threshold current can be obtained.

Thus, the invention described herein makes possible the advantages of (1) providing a semiconductor laser device having a low threshold current being capable of laser emission at high temperatures with high reliability, and (2) providing a low threshold current semiconductor laser device wherein recombination current in regions apart from the laser emission wavelength is suppressed by controlling the energy distribution or spatial distribution of electrons.

These and other advantages of the present invention will become apparent to those skilled in the art upon reading and understanding the following detailed description with reference to the accompanying figures.

BRIEF DESCRIPTION OF THE DRAWINGS

FIG. 21A is a cross sectional drawing illustrative of the structure of the semiconductor laser device of the invention, and FIG. 21B is a cross sectional drawing illustrative of the detailed structure of the multi-quantum wells of the invention.

FIG. 22 is a drawing illustrative of the energy band of the multi-quantum wells of the semiconductor laser device of the invention.

FIGS. 40A through 40D are the energy band diagrams of the semiconductor laser devices of the present invention.

DESCRIPTION OF THE PREFERRED EMBODIMENTS

The preferred embodiments of the invention will be described below with reference to the accompanying drawings.

EXAMPLE 1

Figure 1:
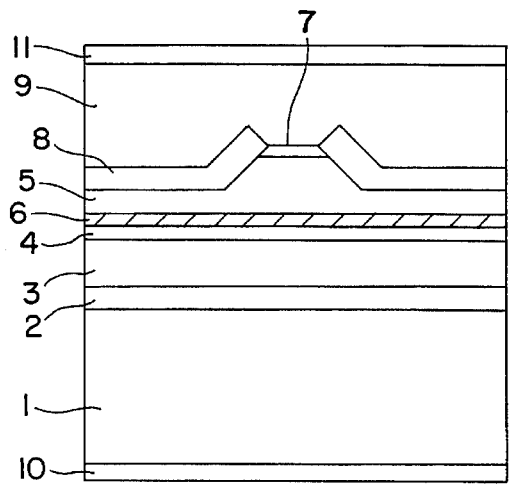
FIG. 1 is a cross sectional view of a first example of a red semiconductor laser device of the transverse mode control type having a multi-quantum barrier according to the invention.

FIG. 1 shows a cross sectional view of a red semiconductor laser device of the transverse mode control type according to the invention. The semiconductor laser device has an n-GaAs substrate 1 and a multi-layered structure formed on the substrate 1 as shown in FIG. 1. The multi-layered structure includes an n-GaAs buffer layer 2 formed on the top surface of the substrate 1, an n-$(Al_{0.6}Ga_{0.4})_{0.51}In_{0.49}P$ cladding layer 3, a $(Al_{0.15}Ga_{0.85})_{0.51}In_{0.49}P$ active layer 4, a multi-quantum barrier (MQB) 6, a p-$(Al_{0.6}Ga_{0.4})_{0.51}In_{0.49}P$ cladding layer 5, a p-$Ga_{0.51}In_{0.49}P$ cladding layer 7, an n-GaAs current block layer 8 and a p-GaAs cap layer 9. The bottom surface of the substrate 1 and top surface of the cap layer 9 are provided with a p-electrode 11 and an n-electrode 10, respectively.

Figure 11:
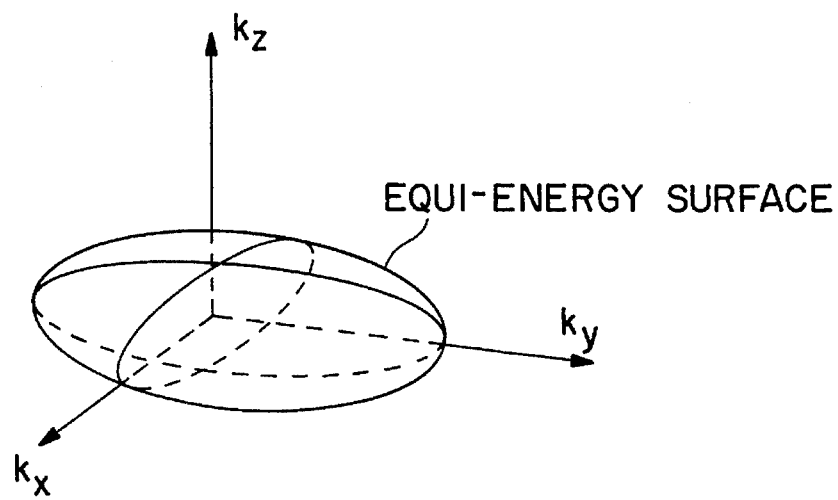
FIG. 11 is a drawing illustrative of the dependence of the equi-energy surface of positive holes in the wave number k space in the x, y, z directions, explanatory of the effects of the multi-quantum barrier in the third example of the invention.

One major difference of this semiconductor laser device from the semiconductor laser device shown in FIG. 11 is that the semiconductor laser device of the invention has a multi-quantum barrier 6 having a novel structure being provided between the $(Al_{0.6}Ga_{0.4})_{0.51}In_{0.49}P$ cladding layer 5 and the $(Al_{0.15}Ga_{0.85})_{0.51}In_{0.49}P$ active layer 4.

Figure 2:
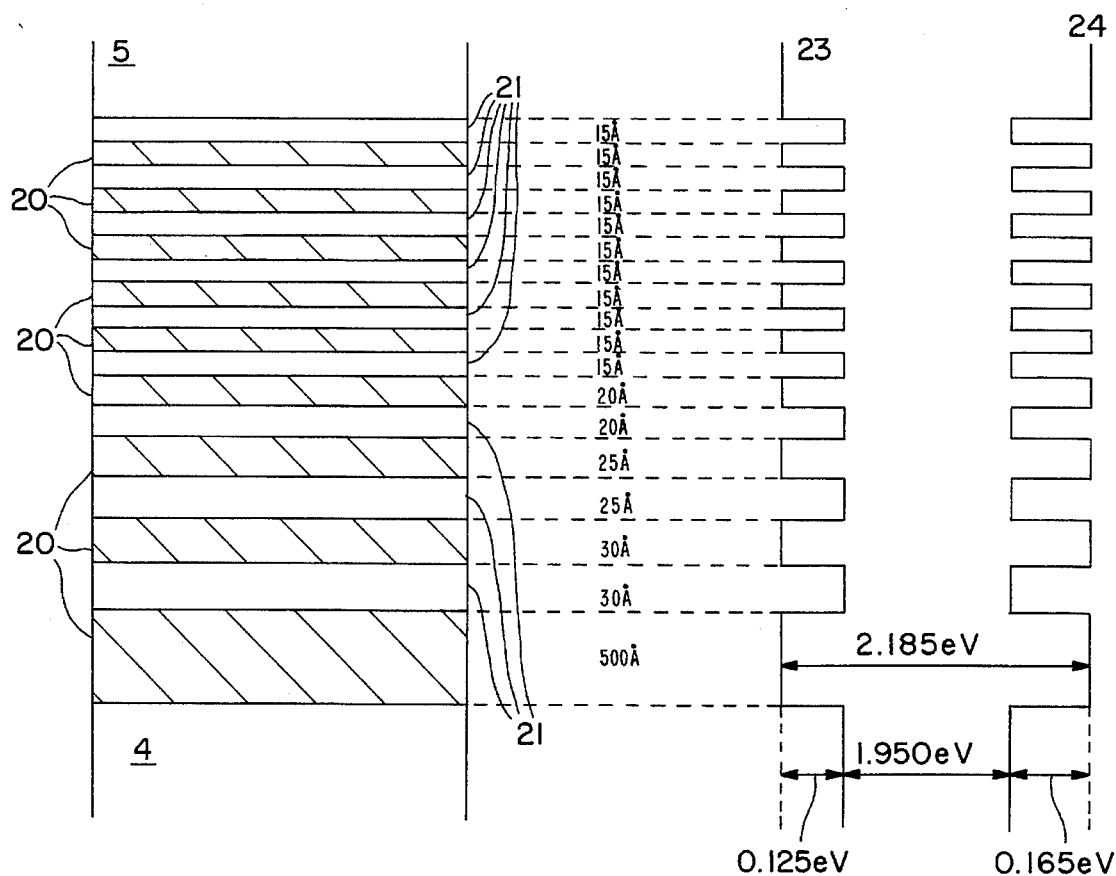
FIG. 2 is a drawing illustrative of the detailed structure, thickness and band structure of the multi-quantum barrier of the first example of the invention.

FIG. 2 shows the detailed structure of the multi-quantum barrier 6. The multi-quantum barrier 6 has p-$(Al_{0.6}Ga_{0.4})_{0.51}In_{0.49}P$ barrier layers 20 having a relatively broad band gap and $(Al_{0.15}Ga_{0.85})_{0.51}In_{0.49}P$ well layers 21 having a relatively narrow band gap being laminated alternately.

The p-$(Al_{0.6}Ga_{0.4})_{0.51}In_{0.49}P$ barrier layer, the first layer from the substrate 1, has a thickness as great as 500 angstroms. This is for the purpose of preventing electrons from leaking out of the $(Al_{0.15}Ga_{0.85})_{0.51}In_{0.49}P$ active layer 4 by tunneling. As shown in FIG. 2, the thickness of the p-$(Al_{0.6}Ga_{0.4})_{0.51}In_{0.49}P$ barrier layer 20 and a thickness of the p-$(Al_{0.15}Ga_{0.85})_{0.51}In_{0.49}P$ well layer 21 which constitute the multi-quantum barrier 6 decreases from 30 angstroms at the second layer down to 20 angstroms, as the distance from the $(Al_{0.15}Ga_{0.85})_{0.51}In_{0.49}P$ active layer 4 increases. Thickness remains constant beyond the fourth layer of $(Al_{0.15}Ga_{0.85})_{0.51}In_{0.49}P$ well layers 21.

Figure 3:
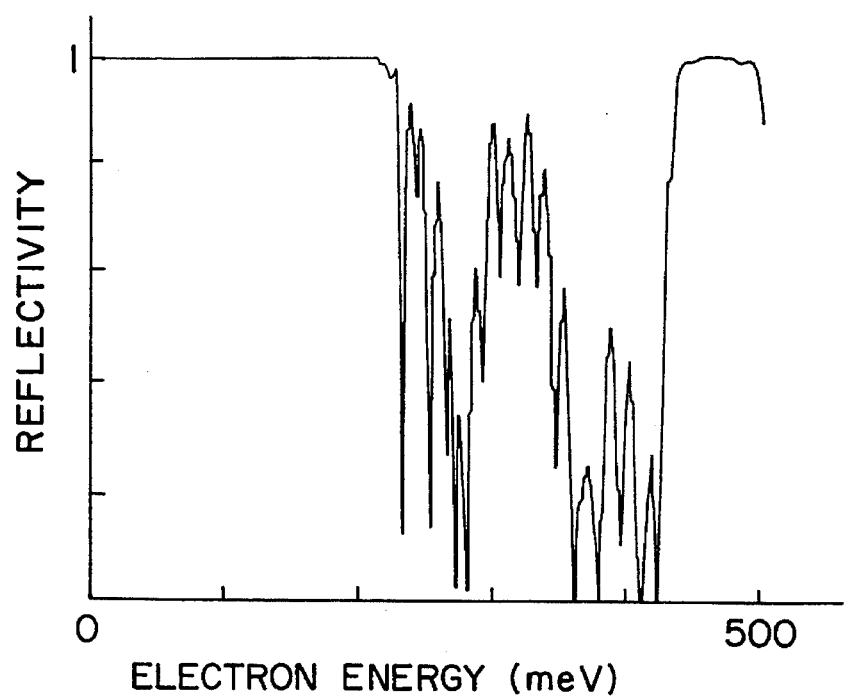
FIG. 3 is a drawing illustrative of the change of the electron-wave reflectivity of the multi-quantum barrier with the electron energy in the first example of the invention.

FIG. 3 shows the change of the electronwave reflectivity of the multi-quantum barrier 6 with the electron energy in this semiconductor laser device. As can be seen from FIG. 3, reflectivity of a value 1 is maintained up to the energy of 220 meV. As the barrier against electrons in a semiconductor laser device without the multi-quantum barrier 6 is about 125 meV, the multi-quantum barrier 6 increased the barrier about 1.8 times.

Figure 4:
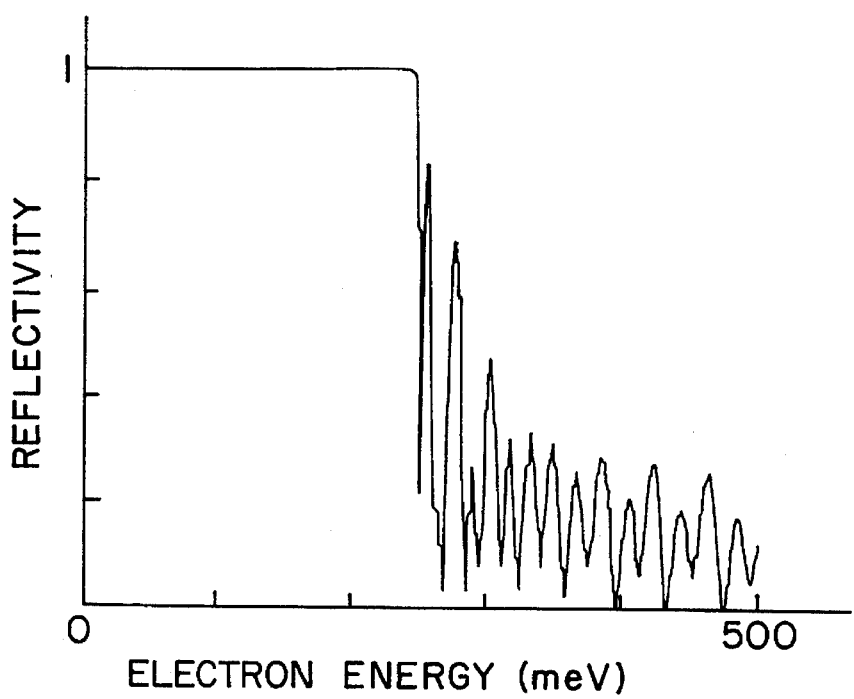
FIG. 4 is a drawing illustrative of the change of the electron-wave reflectivity of the multi-quantum barrier with the electron energy in the semiconductor laser device employing the multi-quantum barrier of the prior art.

Suppose that the thickness of, for example, the third barrier layer and the fourth barrier layer among the layers constituting the multi-quantum barrier 6 is decreased by the thickness of a 2-atom layer, namely 5.66 angstroms, the relationship between the electron-wave reflectivity and the electron energy in this case is shown in FIG. 4. Comparison of this graph with FIG. 3 shows that a decrease of the thickness by the thickness of a 2-atom layer during manufacture does not change the barrier height against electrons. Although the above description deals with a case where the thickness of two barrier layers changes, the barrier height remains unchanged if the thickness of other barrier layer or well layer changes, provided that the change in thickness within a range corresponding to the thickness of a 2-atom layer. As a result, the barrier between the $(Al_{0.15}Ga_{0.85})_{0.51}In_{01.49}P$ active layer 4 and the multi-quantum barrier 6 can be maintained high with electrons being reflected toward the active layer, thereby making such characteristic improvements as reduction of threshold current and higher temperature stability possible even in a semiconductor laser device emitting in a shorter wavelength.

As shown in FIG. 1, the $(Al_{0.6}Ga_{0.4})_{0.51}In_{0.49}P$ cladding layer 5 has the p-$Ga_{0.51}In_{0.49}P$ layer 7 formed on the top surface thereof. And the p-$Ga_{0.51}In_{0.49}P$ layer 7 and a part of the $(Al_{0.6}Ga_{0.4})_{0.51}In_{0.49}P$ cladding layer 5 are made in mesa-stripe configuration of a trapezoid. The trapezoid is adjoined by an n-GaAs current block layer 8 on either side. Placed on top of the p-$Ga_{0.51}In_{0.49}P$ layer 7 and the n-GaAs current block layer 8 is the p-GaAs contact layer 9. The trapezoid is made to have a width 5 μm so that the basic transverse mode is enabled in the $(Al_{0.15}Ga_{0.85})_{0.51}In_{0.49}P$ active layer 4. The n-GaAs contact layer 9 has a p-electrode 11 made of a material such as Cr/Pt/Au deposited thereon, and the n-GaAs substrate 1 has an n-electrode 10 made of a material such as Au/Ge/Ni deposited thereon.

Although the multi-quantum barrier 6 is placed between the $(Al_{0.15}Ga_{0.85})_{0.51}In_{0.49}P$ active layer 4 and the p-$(Al_{0.6}Ga_{0.4})_{0.51}In_{0.49}P$ cladding layer 5 in this example, the invention has a significant effect also when the p-$(Al_{0.6}Ga_{0.4})_{0.51}In_{0.49}P$ cladding layer 5 as a whole is made in such a multi-quantum well structure as the thicknesses of the barrier layers and the well layers change similarly to the multi-quantum barrier 6. Further, it is confirmed that the electron-wave reflectivity can be maintained if the thickness of both the barrier layer and the well layer changes, with such a structure as the thickness increases with the distance from the active layer.

Although this example is described in such a structure as the thickness of the barrier layer and the well layer decreases as the distance from the active layer increases, the invention has significant effects if at least one of the second or the following barrier layer and the well layer which constitute the multi-quantum barrier 6 comprises layers of at least two or more values of thickness.

Although the materials for the semiconductor laser device are specified in this example, a semiconductor laser device having a low threshold current, a high temperature stability and good characteristics can also be manufactured if $(Al_yGa_{1-y})_{0.51}In_{0.49}P$ is used for the cladding layer and $(Al_zGa_{1-z})_{0.51}In_{0.49}P$ $(0 \leq z \leq y \leq 1)$ is used for the active layer.

Although a semiconductor laser device employing AlGaInP is described in this example, the invention has significant effects with other materials. The invention also has significant effects also with a semiconductor laser device made of materials of group II–VI elements, as well as a semiconductor laser device made of materials of group III–V elements.

EXAMPLE 2

Figure 5:
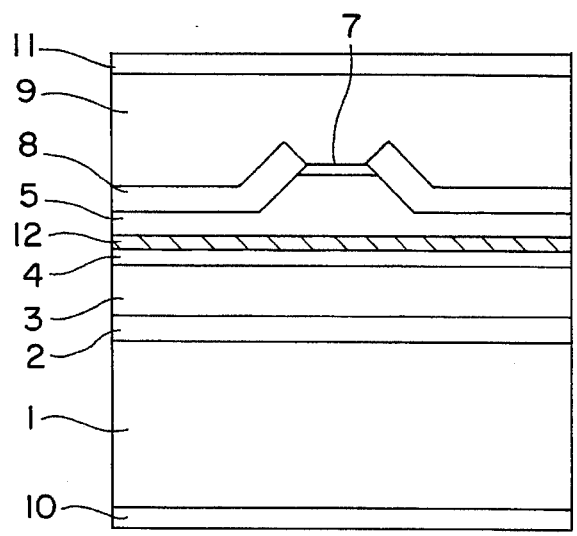
FIG. 5 is a cross sectional view of a second example of a red semiconductor laser device of the transverse mode control type having a multi-quantum barrier according to the invention.

FIG. 5 shows a cross sectional view of another red semiconductor laser device of the transverse mode control type of the invention. As shown in FIG. 5, a double heterostructure wherein the $(Al_{0.15}Ga_{0.85})_{0.51}In_{0.49}P$ active layer 4 is interposed between the n-$(Al_{0.6}Ga_{0.4})_{0.51}In_{0.49}P$ cladding layer 3 and the $(Al_{0.6}Ga_{0.4})_{0.51}In_{0.49}P$ cladding layer 5, is placed on the n-GaAs substrate 1 above the n-GaAs buffer layer 2. A multi-quantum barrier 12 is provided between the p-$(Al_{0.6}Ga_{0.4})_{0.51}In_{0.49}P$ cladding layer 5 and the $(Al_{0.15}Ga_{0.85})_{0.51}In_{0.49}P$ active layer 4.

Figure 6:
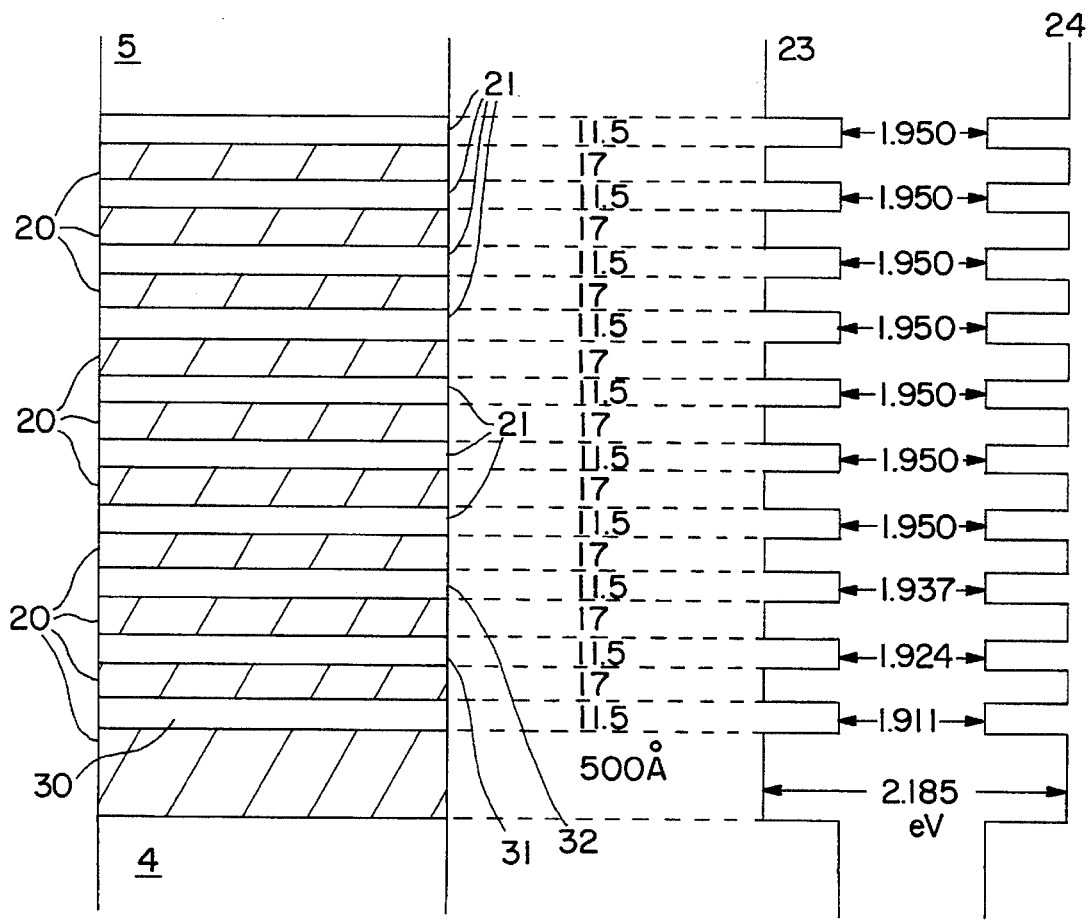
FIG. 6 is a drawing illustrative of the detailed structure, thickness and band structure of the multi-quantum barrier in the second example of the invention.

FIG. 6 shows the detailed structure of the multi-quantum barrier 12. The multi-quantum barrier 12 has p-$(Al_{0.6}Ga_{0.4})_{0.51}In_{0.49}P$ barrier layers 20 having a relatively broad band gap, a p-$(Al_{0.075}Ga_{0.925})_{0.51}In_{0.49}P$ well layer 30, a p$(Al_{0.1}Ga_{0.9})_{0.51}In_{0.49}P$ well layer 31, a p$(Al_{1.25}Ga_{0.875})_{0.51}In_{0.49}P$ well layer 32, and p$(Al_{0.15}Ga_{0.85})_{0.51}In_{0.49}P$ well layers 21 having a relatively narrow band gap.

Among the p-$(Al_{0.6}Ga_{0.4})_{0.51}In_{0.49}P$ barrier layers, the first layer from the substrate 1, has a thickness as great as 500 angstroms. This is for the purpose of preventing electrons from leaking out of the $(Al_{0.15}Ga_{0.85})_{0.51}In_{0.49}P$ active layer 4 by tunneling. As shown in FIG. 6, the thickness of the p-$(Al_{0.6}Ga_{0.4})_{0.51}In_{0.49}P$ barrier layers 20 and the thickness of the p-$(Al_{0.15}Ga_{0.85})_{0.51}In_{0.49}P$ well layers 21 which constitute the multi-quantum barrier 12 are 17 angstroms and 11.5 angstroms respectively.

As shown in FIG. 6, the energy band gap of the well layers increases from 1.911 eV at the first layer to 1.95 eV, as the distance from the $(Al_{0.15}Ga_{0.85})_{0.51}In_{0.49}P$ active layer 4 increases. The energy band gap remains constant beyond the fourth layer of the $(Al_{0.15}Ga_{0.85})_{0.51}In_{0.49}P$ well layers 21.

Even when the thickness of any layer among the layers constituting the multi-quantum barrier 12 is changed by the thickness of a 2-atom layer during manufacture, it does not change the barrier height against electrons.

Although the above description deals with a case where the thickness of two barrier layers change, the barrier height remains unchanged if the thickness of other barrier layers or well layers change, provided that the change in thickness within a range corresponding to the thickness of a 2-atom layer. As a result, the barrier between the $(Al_{0.15}Ga_{0.85})_{0.51}In_{0.49}P$ active layer 4 and the multi-quantum barrier 6 can be maintained high with electrons being reflected toward the active layer, thereby making such characteristic improvements as reduction of the threshold current and higher temperature stability possible even in a semiconductor laser device emitting in a shorter wavelength.

As shown in FIG. 5, the $(Al_{0.6}Ga_{0.4})_{0.51}In_{0.49}P$ cladding layer 5 has the p-$Ga_{0.51}In_{0.49}P$ layer 7 formed on the top surface thereof. And the p-$Ga_{0.51}In_{0.49}P$ layer 7 and a part of the $(Al_{0.6}Ga_{0.4})_{0.51}In_{0.49}P$ cladding layer 5 are made in mesa-stripe configuration of a trapezoid. The trapezoid is adjoined by an n-GaAs current block layer 8 on either side. Placed on top of the p-$Ga_{0.51}In_{0.49}P$ layer 7 and the n-GaAs current block layer 8 is the p-GaAs contact layer 9. The trapezoid is made to have a width 5 μmm so that the basic transverse mode is enabled in the, $(Al_{0.15}Ga_{0.85})_{0.51}In_{0.49}P$ active layer 4. The n-GaAs contact layer 9 has a p-electrode 11 made of a material such as Cr/Pt/Au deposited thereon, and the n-GaAs substrate 1 has an n-electrode 10 made of a material such as Au/Ge/Ni deposited thereon.

Although the multi-quantum barrier 12 is placed between the $(Al_{0.15}Ga_{0.85})_{0.51}In_{0.49}P$ active layer 4 and the p-$(Al_{0.6}Ga_{0.4})_{0.51}In_{0.49}P$ cladding layer 5 in this example, the invention has a significant effect also when the p-$(Al_{0.6}Ga_{0.4})_{0.51}In_{0.49}P$ cladding layer 5 as a whole is made in such a multi-quantum well structure as the energy band gap of the barrier layer and the energy band gap of the well layer change similarly to the multi-quantum barrier 12. It is preferable that the energy level of the quantum state generated in the well layers should be higher than the band level of the $(Al_{0.15}Ga_{0.85})_{0.51}In_{0.49}P$ active layer 4.

Although this example is described in such a structure, as the energy band gap of the well layer which constitute the multi-quantum barrier 12 increases as the distance from the active layer increases, both of the energy band gaps of the well layer and the barrier layer may be change. Further, the invention has significant effects if at least one of the second or the following barrier layer and the well layer which constitute the multi-quantum barrier 12 comprises layers of at least two or more values of thickness.

Although this example is described in such a structure as the energy band gap of the well layer increases, it is confirmed that the electron-wave reflectivity can be maintained even if the thickness of the barrier layer and the well layer changes, with such a structure as the energy band gap decreases with the distance from the active layer.

Although the materials to make the semiconductor laser device are specified in this example, a semiconductor laser device having a low threshold current, a high temperature stability and good characteristics can also be manufactured if $(Al_yGa_{1-y})_{0.51}In_{0.49}P$ is used for the cladding layer and $(Al_zGa_{1-z})_{0.51}In_{0.49}P$ ($0 \leq z \leq y \leq 1$) is used for the active layer.

Although a semiconductor laser device employing AlGaInP is described in this example, the invention has significant effects with other materials. The invention has significant effects also with a semiconductor laser device made of materials of group II–VI elements, as well as a semiconductor laser device made of materials of group III–V elements.

Although such material as is capable of lattice matching to the substrate is assumed for the barrier layers and the well layers in the description of this example, strain may be applied to each layer in order to change the energy band gap of the barrier layer and the well layer. For example, compressive strain may be applied by increasing the In content in the well layer or tensile strain may be applied by decreasing the In content in the barrier layer.

Although great effects can be obtained by employing the structure of the first example or the structure of the second example separately, great effects can also be obtained with such a constitution as combines the structures of both the first example and the second example.

EXAMPLE 3

Figure 7:
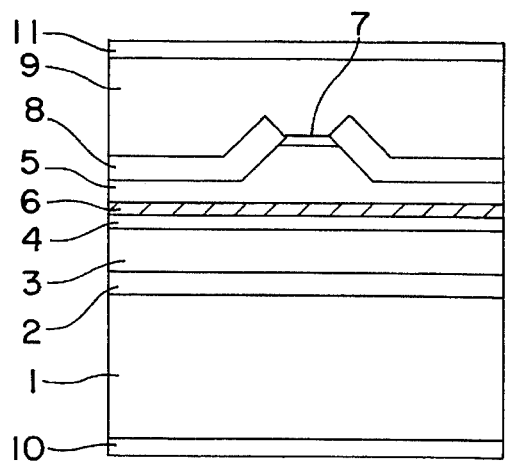
FIG. 7 is a cross sectional view of a red semiconductor laser device of the transverse mode control type having the multi-quantum barrier in the third example of the invention.

FIG. 7 shows a cross sectional view of another red semiconductor laser device of the transverse mode control type of the invention. As shown in FIG. 7, a double heterostructure wherein the $(Al_{0.2}Ga_{0.8})_{0.5}In_{0.5}P$ active layer 4 interposed between the n-$(Al_{0.7}Ga_{0.3})_{0.5}In_{0.5}P$ cladding layer 3 and the $(Al_{0.7}Ga_{0.3})_{0.5}In_{0.5}P$ cladding layer 5 is placed on the n-GaAs substrate 1 above the n-GaAs buffer layer 2, for example. A multi-quantum barrier 6 is provided between the p-$(Al_{0.7}Ga_{0.3})_{0.5}In_{0.5}P$ cladding layer 5 and the $(Al_{0.2}Ga_{0.8})_{0.5}In_{0.5}P$ active layer 4.

Figure 8:
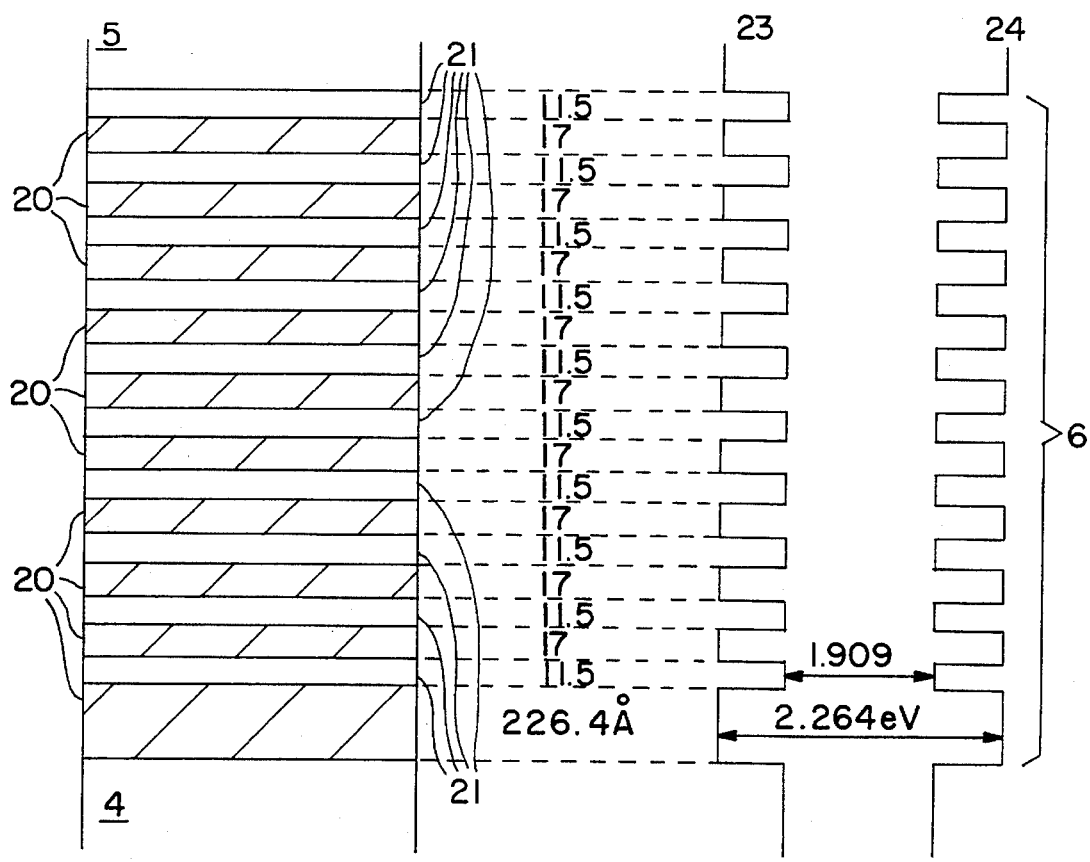
FIG. 8 is a drawing illustrative of the detailed structure, thickness and band structure of the multi-quantum barrier in the third example of the invention.

FIG. 8 shows the detailed structure of the multi-quantum barrier 6. The multi-quantum barrier 6 has a p-$(Al_{0.7}Ga_{0.3})_{0.57}In_{0.43}P$ barrier layer 20 having a relatively broad band gap, p-$(Al_{0.2}Ga_{0.8})_{0.45}In_{0.55}P$ well layer 21. The p-$(Al_{0.7}Ga_{0.3})_{0.57}In_{0.43}P$ barrier layer, the first layer from the substrate 1, has a thickness as great as 226.4 angstroms. This is for the purpose of preventing electrons from leaking out of the $(Al_{0.2}Ga_{0.8})_{0.5}In_{0.5}P$ active layer 4 by tunneling.

Tensile stress is applied to the p-$(Al_{0.7}Ga_{0.3})_{0.57}In_{0.43}P$ barrier layer 20, with the magnitude of the strain $\epsilon$ being –0.5%. Compressive stress is applied to the $(Al_{0.2}Ga_{0.8})_{0.45}In_{0.55}P$ well layer 21, with the magnitude of the strain $\epsilon$ being +0.5%. The sign – of the strain $\epsilon$ represents a tensile stress and + represents a compressive stress. A energy band gap Eg' of the semiconductor layer under strain is given by the following equation.

$$Eg'=Eg+(2a(1-C12/C11)\pm b(1+2C12/C11))\epsilon \qquad \text{Eq.1}$$

The sign – of ± in the equation 1 represents the case of heavy hole band, and the sign + represents the case of light hole band. Eg represents the energy band gap in case no stress is applied, a and b represent deformation potential, and C11 end C12 are elastic constants.

The energy band gaps of the p-$(Al_{0.7}Ga_{0.3})_{0.57}In_{0.43}P$ barrier layers 20 and the $(Al_{0.2}Ga_{0.8})_{0.45}In_{0.55}P$ well layers 21 are calculated from the equation 1 to obtain 2.264 eV and 1.909 eV, respectively. Thus the difference $\Delta g$ in the energy band gap becomes 0.355 eV which is 94 meV greater than the difference of the band gap $\Delta Eg=0.261$ eV between the p-$(Al_{0.7}Ga_{0.3})_{0.5}In_{0.5}P$ barrier layers 20 and the p-$(Al_{0.2}Ga_{0.8})_{0.5}In_{0.5}P$ well layers 21 which constitute the multi-quantum barrier of the prior art.

When a hetero-junction is formed in a semiconductor made of AlGaInP, the energy gap $\Delta Ec$ in the conduction band and energy gap $\Delta Eg$ of the energy band gap are related as follows.

$$\Delta Ec=0.43\Delta Eg \qquad \text{Eq.2}$$

Equation 2 shows that the energy gap in the conduction band of the barrier layers and the well layers which constitute the multi-quantum barrier of the invention is greater than the energy gap in the conduction band of the barrier layer and the well layer which constitute the multi-quantum barrier of the prior art.

Figure 9:
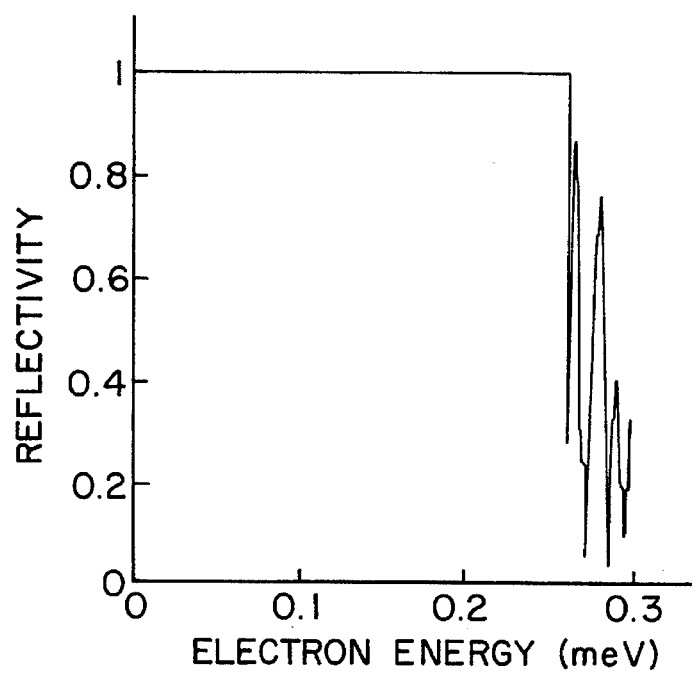
FIG. 9 is a drawing illustrative of the change of the electron-wave reflectivity of the multi-quantum barrier with the electron energy in the third example of the invention.

FIG. 9 shows the change of the electron-wave reflectivity of the multi-quantum barrier 6 with the electron energy in the semiconductor laser device. The reflectivity of a value 1 is maintained up to 260 meV. Because the height of barrier against electrons is 153 meV in a structure without the multi-quantum barrier 6, this means about a 1.7 times increase of the barrier. Height of the barrier can be increased by about 32 meV over the multi-quantum barrier of the prior art. This is because the energy gap in the conduction band of the barrier layers and the well layers which constitute the multi-quantum barrier 6 is greater than that of the multi-quantum barrier of the prior art.

It is preferable that an energy difference ($\Delta Ec$) between a conduction band of the barrier layers and that of the well layers is 100 meV or more. The energy difference $\Delta Ec$ of 100 meV or more provides an excellent barrier whose barrier height is high enough to prevent electrons from overflowing. In view of the barrier height, it is preferable that the number of quantum well layers within the multi-quantum barrier is six or more. If the number of quantum well layers is 5 or less, the multi-quantum barrier dose not serve as a good barrier against the electron-wave.

Figure 10:
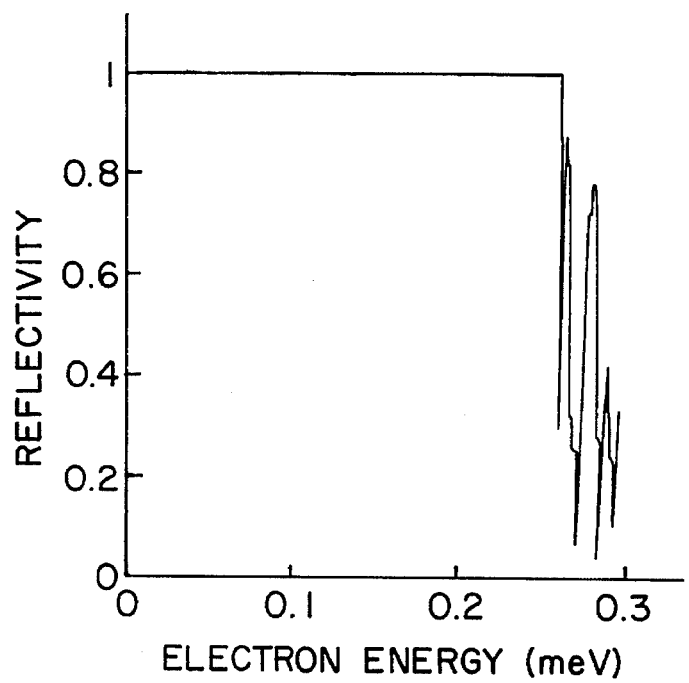
FIG. 10 is a drawing illustrative of the change of the electron-wave reflectivity with the electron energy, explanatory of the effects of the multi-quantum barrier in the third example of the invention.

The fact that the energy gap in the conduction band of the barrier layers and the well layers which constitute the multi-quantum barrier 6 has a great value has another effect as well. That is, reflectivity on electrons is not affected by the change in the thickness of the layers comprising the multi-quantum barrier 6 by the thickness of about 3-atom layer or variations in the thickness of layers. For example, similarly to the case of the multi-quantum barrier of the prior art, thickness of four layers among the ten p-$(Al_{0.7}Ga_{0.3})_{0.51}In_{0.49}P$ barrier layers 20 of the multi-quantum barrier 6 may be increased by the thickness of a 3-atom layer. Even in this case, the barrier height against electrons does not change as can be seen by comparing FIG. 10 with FIG. 9.

Although the above description deals with a case where the thickness of four barrier layers changes, the barrier height remains unchanged if the thickness of other barrier layers or well layers changes, provided that the change in thickness is within a range corresponding to the thickness of a 3-atom layer. As a result, the barrier between the $(Al_{0.2}Ga_{0.8})_{0.5}In_{0.5}P$ active layer 4 and the multi-quantum barrier 6 can be maintained high with electrons being reflected toward the active layer, thereby making such characteristic improvements as reduction of threshold current and higher temperature stability possible even in a semiconductor laser device emitting in shorter wavelength.

As show$_n$ in FIG. 7, the p-$(Al_{0.7}Ga_{0.3})_{0.5}In_{0.5}P$ cladding layer 5 has the p-$Ga_{0.5}In_{0.5}P$ layer 7 being formed on the top surface thereof. And the p-$Ga_{0.5}In_{0.5}P$ layer 7 and a part of the p-$(Al_{0.7}Ga_{0.3})_{0.5}In_{0.5}P$ cladding layer 5 are made in mesa-stripe configuration of a trapezoid. The trapezoid is adjoined by an n-GaAs current block layer 8 on either side. Placed on top of the p-Ga$_{0.5}$In$_{0.5}$P layer 7 and the n-GaAs current block layer 8 is the p-GaAs contact layer 9. The trapezoid is made to have a width 5 μm so that the basic transverse mode is enabled in the (Al$_{0.2}$Ga$_{0.8}$)$_{0.5}$In$_{0.5}$P active layer 4. The n-GaAs contact layer 9 has a p-electrode 11 made of a material such as Cr/Pt/Au deposited thereon, and the n-GaAs substrate 1 has an n-electrode 10 made of a material such as Au/Ge/Ni deposited thereon.

With such a constitution as a tensile stress is applied to the barrier layers which constitute the multi-quantum barrier 6 and a compressive stress is applied to the well layers as described above while maintaining a high value of energy gap ΔEc of the conduction band, the effect of providing a high barrier against electrons and the effect of the multi-quantum barrier 6 as the barrier against electrons remain unchanged even if the thickness of the layers which constitute the multi-quantum barrier 6 changes.

Further an effect as follows can be obtained. In the multi-quantum barrier of the prior art, presence of a number of hetero interfaces hinders the injection of holes into the active layer. However, because the tensile stress is applied to the barrier layers which constitute the multi-quantum barrier 6, an effect of preventing the decrease in the efficiency of injecting holes into the (Al$_{0.2}$Ga$_{0.8}$)$_{0.5}$In$_{0.5}$P active layer 4 can be obtained. The reason for this will be described below.

FIG. 11 is a drawing illustrative of the equi-energy surface of positive holes in the wave number k space in the p-(Al$_{0.7}$Ga$_{0.3}$)$_{0.57}$In$_{0.43}$P barrier layers 20. kx and ky are directions parallel to the layers and kz is a direction perpendicular to the layers. Positive holes are injected into the (Al$_{0.2}$Ga$_{0.8}$)$_{0.5}$In$_{0.5}$P active layer 4. The smaller the effective mass, the greater the energy and, the larger the wave number, the greater the energy. FIG. 11 shows that, in the kz direction, the same energy as those in kx and ky directions can be obtained with a smaller wave number. This means smaller effective mass in the kz direction. Because of the smaller effective mass, the holes can easily pass through the p-(Al$_{0.7}$Ga$_{0.3}$)$_{0.57}$In$_{0.43}$P barrier layers 20, and the efficiency of injecting holes into the (Al$_{0.2}$Ga$_{0.8}$)$_{0.5}$In$_{0.5}$P active layer 4 does not decrease.

Figure 12:
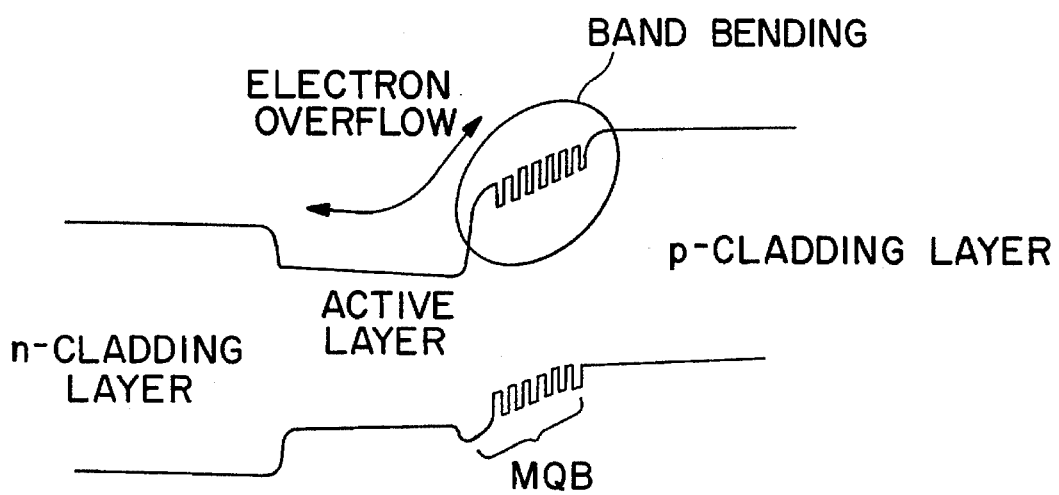
FIG. 12 is a drawing illustrative of the bending observed in the band structure of the multi-quantum barrier of the prior art, explanatory of the effects of the multi-quantum barrier in the third example of the invention.
Figure 13:
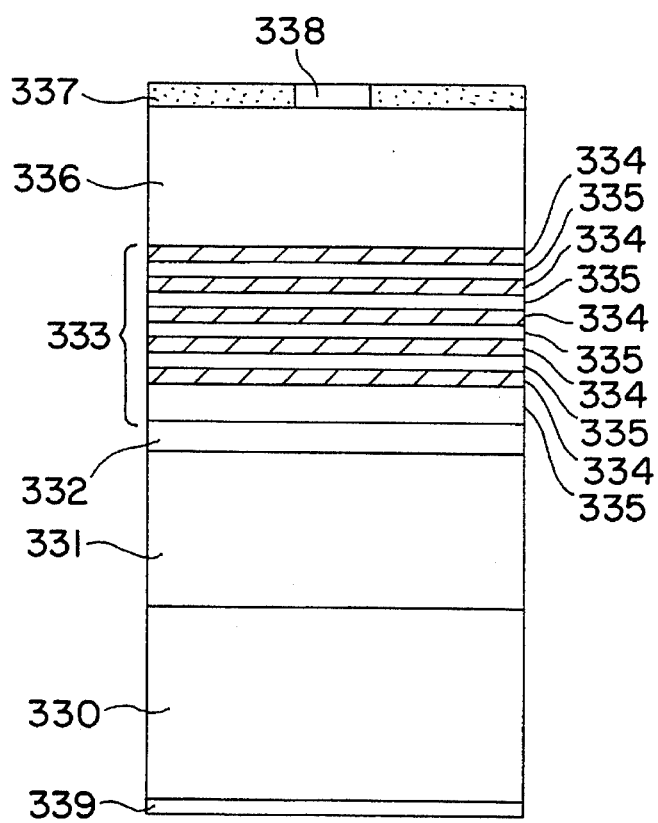
FIG. 13 is a cross sectional view of a blue semiconductor laser device which is an example of applying the invention to a semiconductor laser device of a compound of group II–VI elements.

Further, bending of the band structure as observed in the multi-quantum barrier of the prior art can be prevented. When the efficiency of injecting holes into the active layer 4 decreases, bending of the p-cladding layer as shown in the band structure of FIG. 12 occurs. As a result, it becomes relatively easier for the electrons injected from the n-cladding layer into the active layer to overflow to the p-cladding layer, thereby causing the possibility of decreasing light emission efficiency in the active layer. However, in the multi-quantum barrier of the invention, because the efficiency of injecting holes into the active layer does not decrease, no bending of the band structure occurs and overflow of electrons does not occur.

Although this example is described in a case where a tensile stress is applied to the barrier layers which constitute the multi-quantum barrier 6 and a compressive stress is applied to the well layers, the barrier against electrons can be made higher than the multi-quantum barrier of the prior art also in such a constitution where tensile stress is applied at least to the barrier layer and, because light holes are utilized, the efficiency of injecting holes into the active layer can be increased and thereby a semiconductor laser device having good temperature stability and low threshold current can be obtained.

When a tensile stress is applied to the barrier layers which constitute the multi-quantum barrier 6 and a compressive stress is applied to the well layers, the stress applied to the barrier layer is represented by δ1, the total thickness of the barrier layers by d1, the stress applied to the well by δ2, a total thickness of the well layers by d2. Then a semiconductor laser device having good characteristics can be obtained without dislocation or other defects due to accumulated strain by selecting such values for these parameters as satisfy the following equation.

$$\delta_1 \times d_1 = \delta_2 \times d_2 \qquad \text{Eq. 3}$$

In equation 3, the stress δ is given as follows where a is the lattice constant of the semiconductor substrate and a// is the lattice constant of the barrier layers or well layers.

$$\epsilon = (a - a//)/a \qquad \text{Eq. 4}$$

$$\delta = \epsilon(C11 - C12) \qquad \text{Eq. 5}$$

Although the multi-quantum barrier 6 is placed between the (Al$_{0.2}$Ga$_{0.8}$)$_{0.5}$In$_{0.5}$P active layer 4 and the p-(Al$_{0.7}$Ga$_{0.3}$)$_{0.5}$In$_{0.5}$P cladding layer 5 in this example, the invention has a significant effect also when the entire p-(Al$_{0.7}$Ga$_{0.3}$)$_{0.5}$In$_{0.5}$P cladding layer 5 is made in such a structure as comprises the p-(Al$_{0.7}$Ga$_{0.3}$)$_{0.57}$In$_{0.43}$P barrier layers 20 and the p-(Al$_{0.2}$Ga$_{0.8}$)$_{0.45}$In$_{0.55}$P well layers 21 similarly to the multi-quantum barrier 6.

Although the materials to make the semiconductor laser device are specified in this example, a semiconductor laser device having a low threshold current, a high temperature stability and good characteristics can also be manufactured if (Al$_y$Ga$_{1-y}$)$_{0.5}$In$_{0.5}$P is used for the cladding layer and (Al$_z$Ga$_{1-z}$)$_{0.5}$In$_{0.5}$P (0≦z≦y≦1) is used for the active layer.

Although a semiconductor laser device employing AlGaInP is shown in this example, the invention has significant effects with other materials. The invention has significant effects also with a semiconductor laser device made of materials of group II–VI elements, as well as a semiconductor laser device made of materials of group III–V elements. For example, by making the multi-quantum barrier in such a constitution as comprises a ZnS barrier 335 and a Cd$_{0.3}$Zn$_{0.7}$Se well 334, a tensile stress is applied to the ZnS barrier and a compressive stress is applied to the Cd$_{0.3}$Zn$_{0.7}$Se well 334, thereby providing such effects as those of the invention.

EXAMPLE 4

Figure 14:
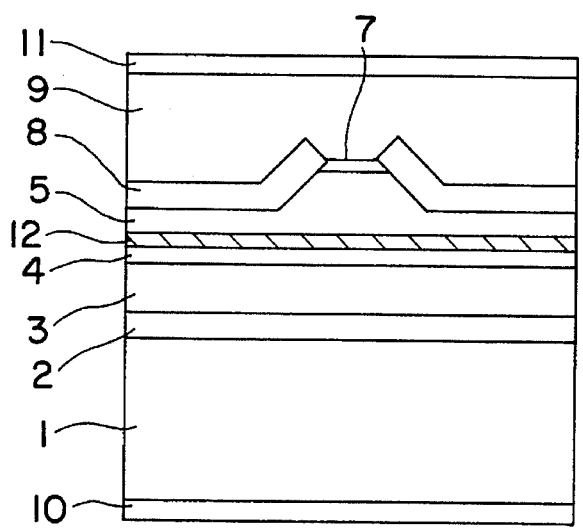
FIG. 14 is a cross sectional view of a fourth example of a red semiconductor laser device of the transverse mode control type having the multi-quantum barrier.

FIG. 14 shows a cross sectional view of another red semiconductor laser device of the transverse mode control type of the invention. As shown in FIG. 14, a double heterostructure wherein the (Al$_{0.2}$Ga$_{0.8}$)$_{0.5}$In$_{0.5}$P active layer 4 interposed between the n-(Al$_{0.7}$Ga$_{0.3}$)$_{0.5}$In$_{0.5}$P cladding layer 3 and the (Al$_{0.7}$Ga$_{0.3}$)$_{0.5}$In$_{0.5}$P cladding layer 5, is placed on the n-GaAs substrate 1 above the n-GaAs buffer layer 2, for example. A multi-quantum barrier 12 is provided between the p-(Al$_{0.7}$Ga$_{0.3}$)$_{0.5}$In$_{0.5}$P cladding layer 5 and the (Al$_{0.2}$Ga$_{0.8}$)$_{0.51}$In$_{0.49}$P active layer 4.

Figure 15:
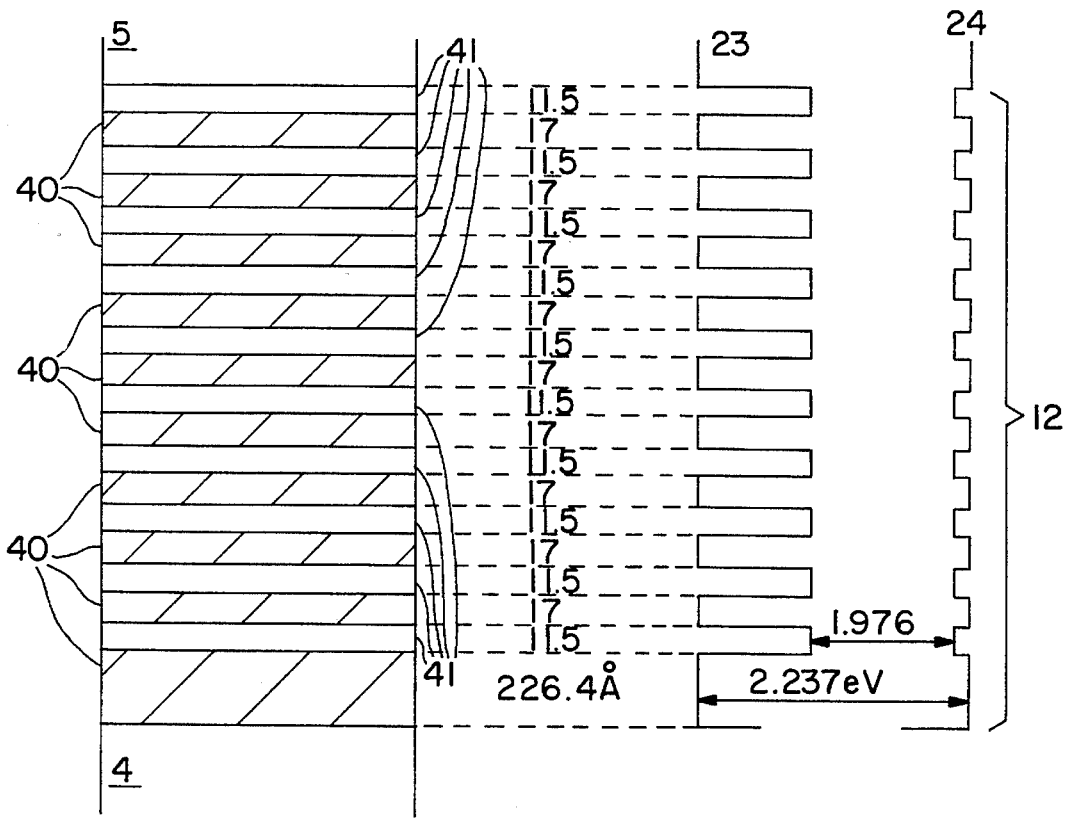
FIG. 15 is a drawing illustrative of the detailed structure, thickness and band structure of the multi-quantum barrier in the fourth example of the invention.
Figure 16:
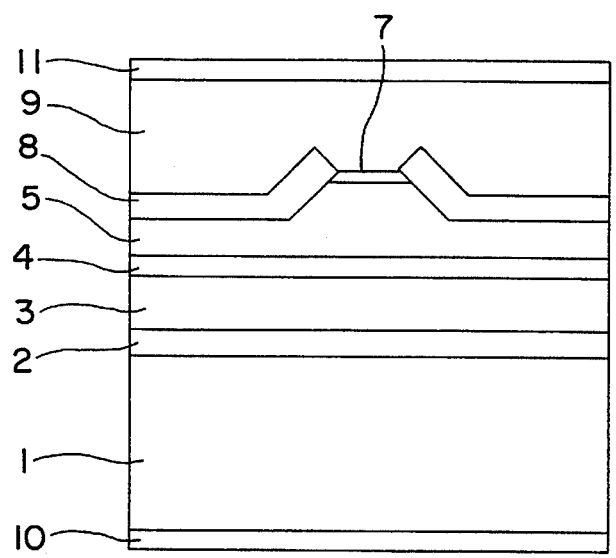
FIG. 16 is a cross sectional drawing illustrative of the structure of the semiconductor laser device of the prior art.
Figure 17:
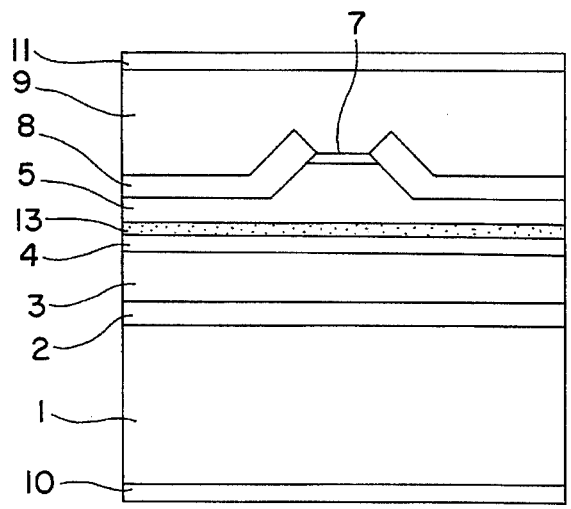
FIG. 17 is a cross sectional view of a red semiconductor laser device of the transverse mode control type having the multi-quantum barrier of the prior art.
Figure 18:
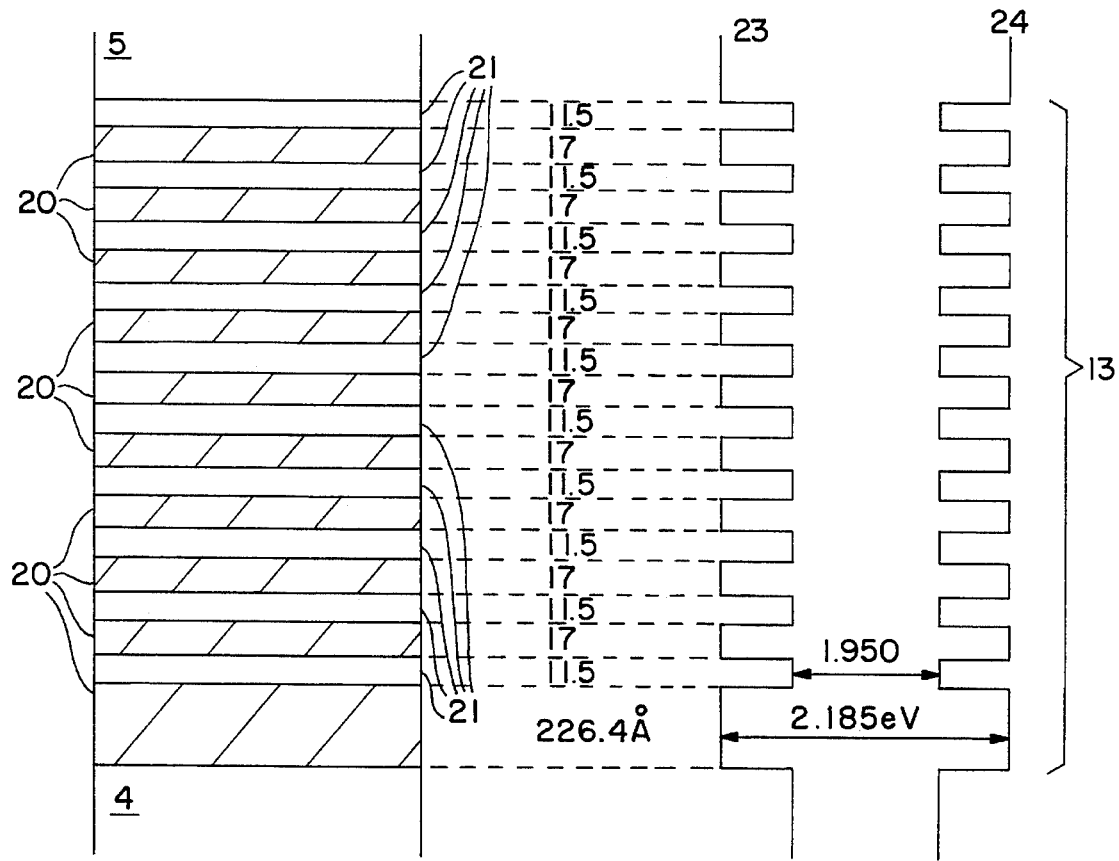
FIG. 18 is a drawing illustrative of the detailed structure, thickness and band structure of the multi-quantum barrier of the semiconductor laser device of the prior art.
Figure 19:
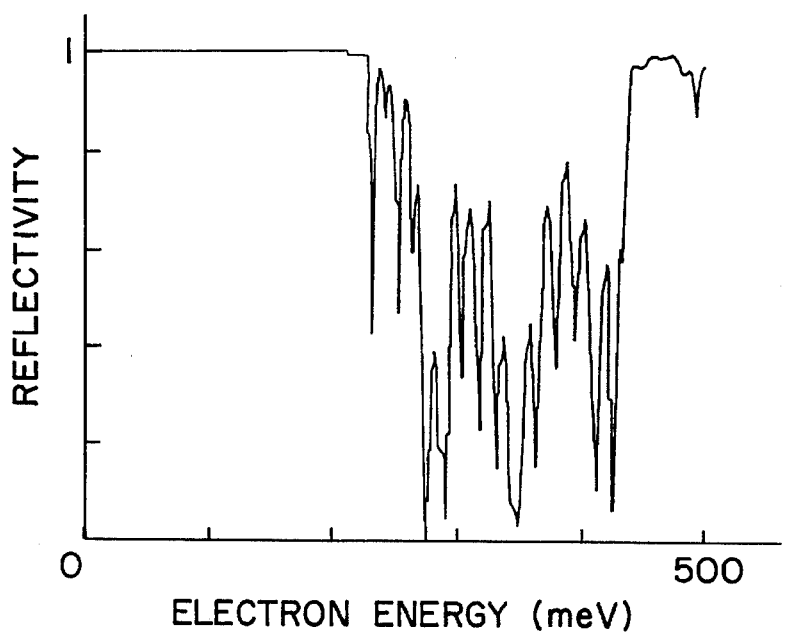
FIG. 19 is a drawing illustrative of the change of the electron-wave reflectivity of the multi-quantum barrier with the electron energy in the semi-conductor laser device employing the multi-quantum barrier of the prior art.
Figure 20:
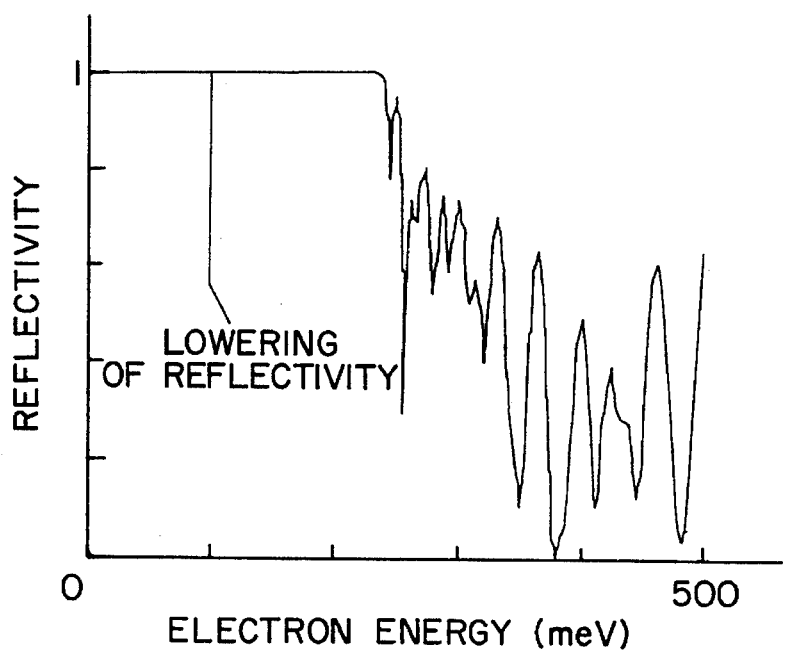
FIG. 20 is a drawing illustrative of the change of the electron-wave reflectivity with the electron energy, explanatory of the problems of the prior art.

FIG. 15 shows the detailed structure of the multi-quantum barrier 12. The multi-quantum barrier 12 has p-(Al$_{0.7}$Ga$_{0.3}$)$_{0.5}$In$_{0.5}$P barrier layers 40 having a relatively broad band gap, and P$^-$-(Al$_{0.2}$Ga$_{0.8}$)$_{0.5}$In$_{0.5}$P well layers 41. The p-(Al$_{0.7}$Ga$_{0.3}$)$_{0.5}$In$_{0.5}$P barrier layer 41, the first layer from the substrate 1, has a thickness as great as 226.4 angstroms. This is for the purpose of preventing electrons from leaking out of the (Al$_{0.2}$Ga$_{0.8}$)$_{0.5}$In$_{0.5}$P active layer 4 by tunneling.

The p-$(Al_{0.7}Ga_{0.3})_{0.5}In_{0.5}P$ barrier layers 40 have a high carrier concentration of $7 \times 10^{17} cm^{-3}$. On the other hand, the p⁻-$(Al_{0.2}Ga_{0.8})_{0.5}In_{0.5}P$ well layers 41 have a low carrier concentration of $1 \times 10^{17} cm^{-3}$.

The p-$(Al_{0.7}Ga_{0.3})_{0.5}In_{0.5}P$ barrier layers 40 have an energy band gap of 2.237 eV and the p⁻-$(Al_{0.2}Ga_{0.8})_{0.5}In_{0.5}P$ well layers 41 have an energy band gap of 1.976 eV.

Because the p-$(Al_{0.7}Ga_{0.3})_{0.5}In_{0.5}P$ barrier layers 40 have a high carrier concentration and the p⁻-$(Al_{0.2}Ga_{0.8})_{0.5}In_{0.5}P$ well layers 41 have a low carrier concentration, the energy gap of the conduction band between the barrier layers and the well layers can be made higher as shown in FIG. 15.

When a large energy gap of the conduction band between the barrier layers and the well layers which constitute the multi-quantum barrier 12 can be obtained, the barrier height of the multi-quantum barrier 12 can be made higher than that of the multi-quantum barrier of the prior art.

The fact that the energy gap in the conduction band of the barrier layers and the well layers which constitute the multi-quantum barrier 12 has a great value and has another effect as well. That is, reflectivity on electrons is not affected by the change in the thickness of the layers comprising the multi-quantum barrier 12 by the thickness of about a 3-atom layer or by variation in the thickness between layers. For example, similarly to the case of the multi-quantum barrier of the prior art, suppose that the thickness of four layers among the ten p-$(Al_{0.7}Ga_{0.3})_{0.5}In_{0.5}P$ barrier layers 40 of the multi-quantum barrier 12 are increased by the thickness of a 3-atom layer. Even in this case, the barrier height against electrons does not change unlike in the multi-quantum barrier of the prior art.

Although the above description deals with a case where the thickness of four barrier layers changes, the barrier height remains unchanged if the thickness of other barrier layers or well layers change, provided that the change in thickness is within a range corresponding to the thickness of a 3-atom layer. As a result, the barrier between the $(Al_{0.2}Ga_{0.8})_{0.5}In_{0.5}P$ active layer 4 and the multi-quantum barrier 12 can be maintained high with electrons being reflected toward the active layer, thereby making such characteristic improvements as reduction of threshold current and higher temperature stability possible even in a semiconductor laser device emitting in shorter wavelength.

As shown in FIG. 14, the $(Al_{0.7}Ga_{0.3})_{0.5}In_{0.5}P$ cladding layer 5 has the p-$Ga_{0.5}In_{0.5}P$ layer 7 being formed on the top surface thereof. And the p-$Ga_{0.5}In_{0.5}P$ layer 7 and a part of the $(Al_{0.7}Ga_{0.3})_{0.5}In_{0.5}P$ cladding layer 5 are made in the mesa-stripe configuration of a trapezoid. The trapezoid is adjoined by an n-GaAs current block layer 8 on either side. Placed on top of the p-$Ga_{0.5}In_{0.5}P$ layer 7 and the n-GaAs current block layer 8 is the p-GaAs contact layer 9. The trapezoid is made to have a Width of 5 μmm so that the basic transverse mode is enabled in the $(Al_{0.2}Ga_{0.8})_{0.5}In_{0.5}P$ active layer 4. The n-GaAs contact layer 9 has a p-electrode 11 made of a material such as Cr/Pt/Au deposited thereon, and the n-GaAs substrate 1 has an n-electrode 10 made of a material such as Au/Ge/Ni deposited thereon.

Although the multi-quantum barrier 12 is placed between the $(Al_{0.2}Ga_{0.8})_{0.5}In_{0.5}P$ active layer 4 and p-$(Al_{0.7}Ga_{0.3})_{0.5}In_{0.5}P$ cladding layer 5 in this example, the invention has a significant effect also when the p-$(Al_{0.7}Ga_{0.3})_{0.5}In_{0.5}P$ cladding layer 5 as a whole is made in such a structure wherein barrier layers 40 and well layers 41 are included similarly to the multi-quantum barrier 12.

Although the materials to make the semiconductor laser device are specified in this example, a semiconductor laser device having a low threshold current, a high temperature stability and good characteristics can also be manufactured if $(Al_yGa_{1-y})_{0.5}In_{0.5}P$ is used for the cladding layer and $(Al_zGa_{1-z})_{0.51}In_{0.49}P$ ($0 \leq z \leq y \leq 1$) is used for the active layer.

Although a semiconductor laser device employing AlGaInP is shown in this example, the invention has significant effects with other materials. The invention has significant effects also with a semiconductor laser device made of materials of group II–VI elements, as well as a semiconductor laser device made of materials of group III–V elements.

Although such material as is capable of lattice matching to the substrate is assumed for the barrier layers and the well layers in the description of this example, strain may be applied to each layer in order to change the energy band gap of the barrier layers and the well layers. For example, compressive strain may be applied by increasing the In content in the well layers or tensile strain may be applied by decreasing the In content in the barrier layers.

Although great effects can be obtained by employing the structure of the third example or the structure of the fourth example separately, great effects can also be obtained with a constitution that combines the structures of both the third example and the fourth example.

EXAMPLE 5

FIG. 21A shows a semiconductor laser device of the invention. FIG. 21B shows a cross section of a strained multi-quantum well region of the semiconductor laser device shown in FIG. 21A.

In this semiconductor laser device, as shown in FIG. 21A, an n-$(Al_{0.7}Ga_{0.3})_{0.51}In_{0.49}P$ cladding layer 202, a $(Al_{0.5}Ga_{0.5})_{0.51}In_{0.49}P$ optical guide layer 203, a multi-quantum well layer 204 and a pair of $(Al_{0.5}Ga_{0.5})_{0.51}In_{0.49}P$ optical guide layers 203, are formed on an n-GaAs Substrate 201, and a $(Al_{0.7}Ga_{0.3})_{0.51}In_{0.49}P$ cladding layer 205 in the form of stripes is formed further thereon. The cladding layer 205 in the form of stripe is embedded in a current block layer 207. The multi-quantum well layer 204 has barrier layers 212 and well layers 211 alternating on each other and out-barrier layers 212a formed outside these layers.

A manufacturing method for the semiconductor laser device of this example will be described below.

First, the n-$(Al_{0.7}Ga_{0.3})_{0.51}In_{0.49}P$ cladding layer 202, the first $(Al_{0.5}Ga_{0.5})_{0.51}In_{0.49}P$ optical guide layer 203, the multi-quantum well layer 204, the second $(Al_{0.5}Ga_{0.5})_{0.51}In_{0.49}P$ optical guide layer 203, the p-$(Al_{0.7}Ga_{0.3})_{0.51}In_{0.49}P$ cladding layer 205 and p-GaInP protection layer 206 are formed consecutively on an n-GaAs substrate 201 in the first crystal growth.

Then after etching the cladding layer 205 in stripes, an n-GaAs current block layer 207 is formed by the second crystal growth. Last, a p-GaAs contact layer 208 is formed by the third growth.

In the multi-quantum well layer 204, the well layers 211 comprise Ga0.44In0.56P having a thickness of 3 nm, and the barrier layers 212 comprise n-$(Al_{0.7}Ga_{0.3})_{0.51}In_{0.49}P$ of a thickness 5 nm. A compression strain of 0.5% is applied to the well layer 211.

In this example, the thickness of the outermost out-barrier layer 212a adjoining the optical guide layer 203 is 20 nm, which is thicker than other barrier layers 212. One of the major features of the semiconductor laser device is that the relatively thick outbarrier layer 212a is provided as described above, thereby controlling the electron distribution.

FIG. 22 shows the energy band diagram of the multi-quantum well structure of this semiconductor laser device. The barrier layers 212 and the out-barrier layer 212a are made of the same material as the cladding layers 202 and 205. Also the energy band gap of the barrier layers 212 and the out-barrier layer 212a is greater than the energy band gap of the optical guide layer 203.

In such a multi-quantum well structure, the effect of 2-dimensional carrier confinement within the well layer 211 is reinforced by the potential barrier of the barrier layers 212 and the out-barrier layer 212a.

Further, it is preferable to make the thickness of the optical guide layer (Wb) greater than the thickness of the multi-quantum well layer 204 (Wa), and to make the out-barrier layer 212a thicker than the de Broglie wavelength of the electrons. By employing such a construction, most of the electrons having energies above the conduction band of the optical guide layers 203 can be made to distribute in the optical guide layers 203 and not present in the multi-quantum well region. This means that electrons having energies in a region from the reference potential to the conduction band of the optical guide layers 203 exist in the multi-quantum well region. Consequently, electrons having energies in the region from the reference potential to the conduction band of the optical guide layers 203 are confined within a 2-dimensional plane in the multi-quantum well region, and electrons having energies above the conduction band of the optical guide layer 203 are confined in a 2-dimensional plane (localized) in the optical guide layer 203. According to this example, electron distribution is controlled so that the density of electrons which do not contribute to the laser emission is decreased by providing the out-barrier layer. Thus the recombination current at wavelengths other than the oscillating wavelength is decreased and, thereby, a semiconductor laser device of low threshold current is provided.

Figure 24A:
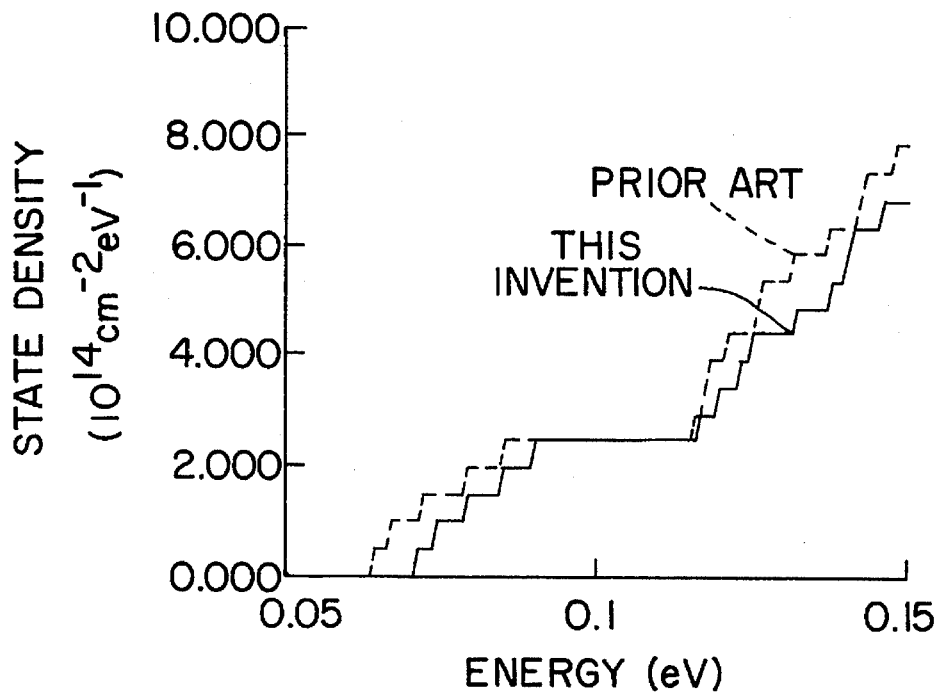
FIG. 24A is a drawing illustrative of the 2-dimensional state density of electrons in the multi-quantum wells.

FIG. 24A shows the state density of electrons in a 2-dimensional distribution. In the multi-quantum well of the invention, the state density beyond the energy corresponding to the potential barrier of the barrier layer is less than in the case of the multi-quantum well of the prior art. Consequently, the proportion of the electrons which can contribute to the laser emission more than in the case of the prior art, namely the proportion of electrons existing near the band edge increases making it possible to obtain greater gain.

Figure 24B:
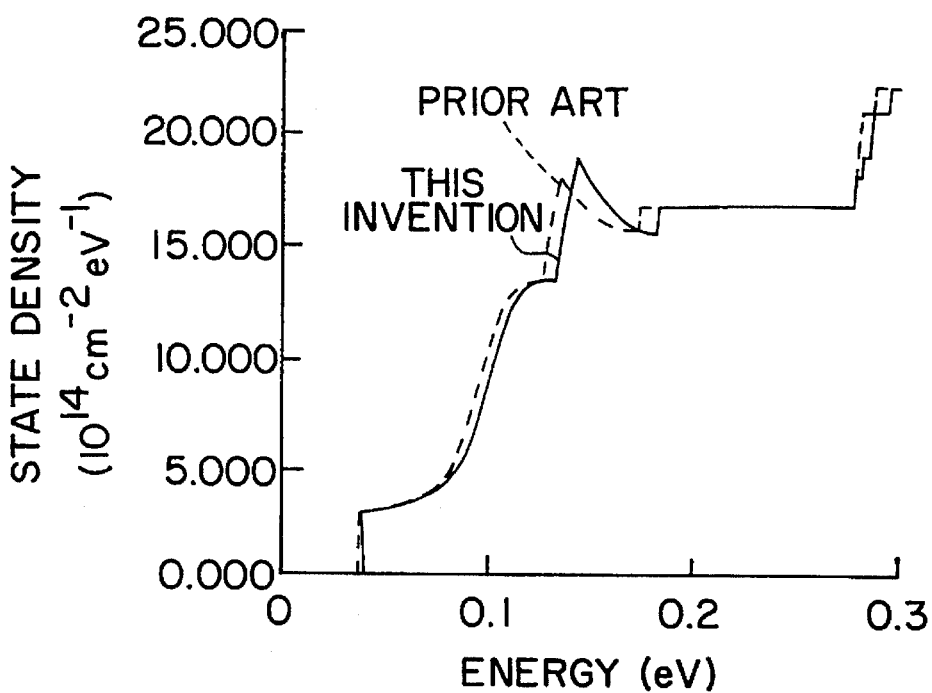
FIG. 24B is a drawing illustrative of the 2-dimensional state density of holes in the multi-quantum wells.

FIG. 24B shows the state density of holes in a 2-dimensional plane. With regard to holes, significant difference from the prior art as shown in FIG. 24A is not observed because the potential barrier to the holes is originally high, though state density is a little lower than in the case of the prior art.

As described above, the multi-quantum well structure of the invention makes it possible to obtain the gain required for laser emission with less carriers, therefore it is capable of suppressing the recombination current which does not contribute to emission in wells and reduces the leak current to the outside of the quantum well.

Figure 25:
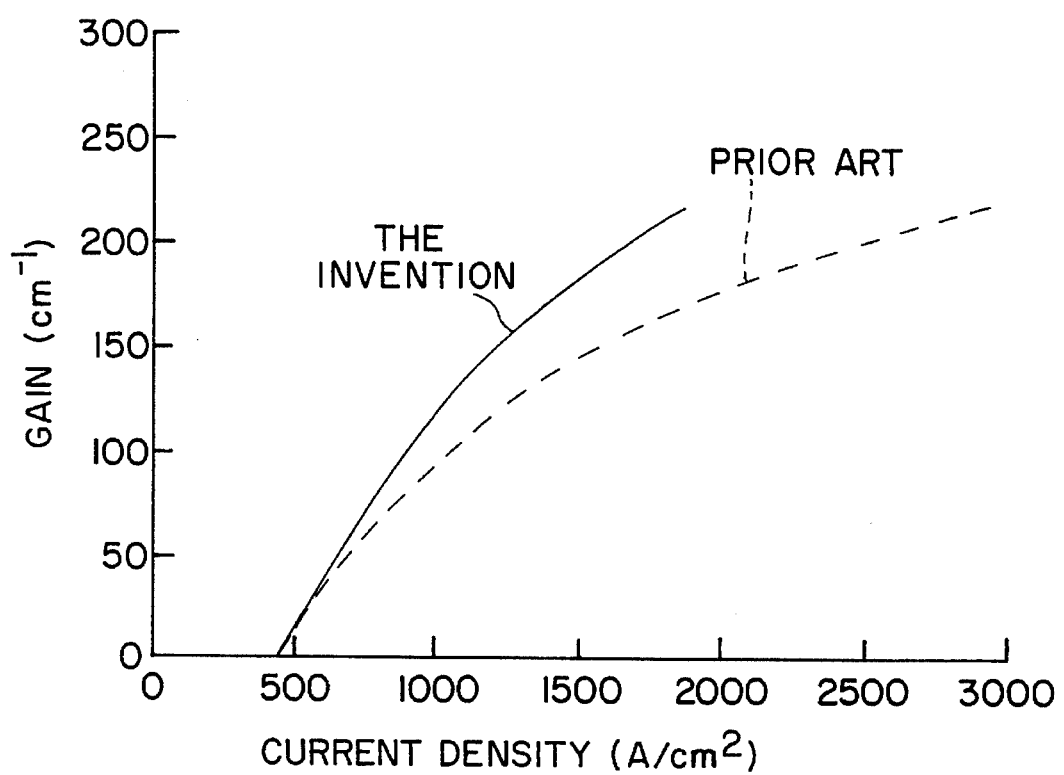
FIG. 25 is a drawing illustrative of the dependence of maximum gain on the injected current density of the multi-quantum wells of the semiconductor laser device of the prior art and the invention.
Figure 26A:
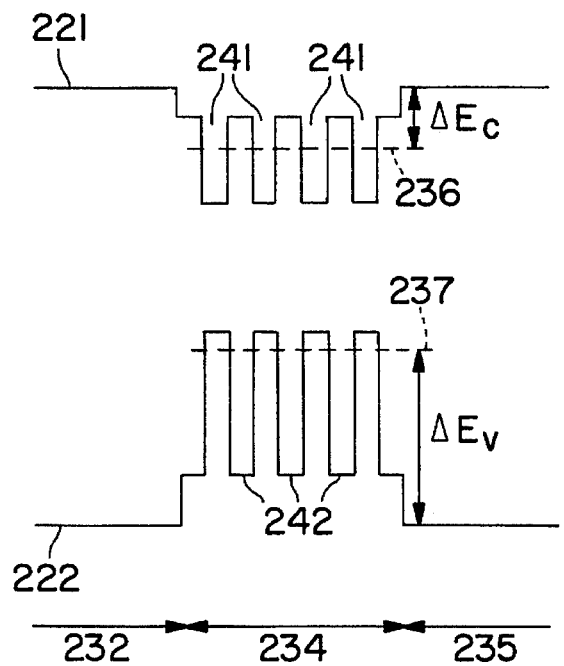
FIGS. 26A and 26B are drawings illustrative of the energy band of the multi-quantum wells of the prior art.
Figure 26B:
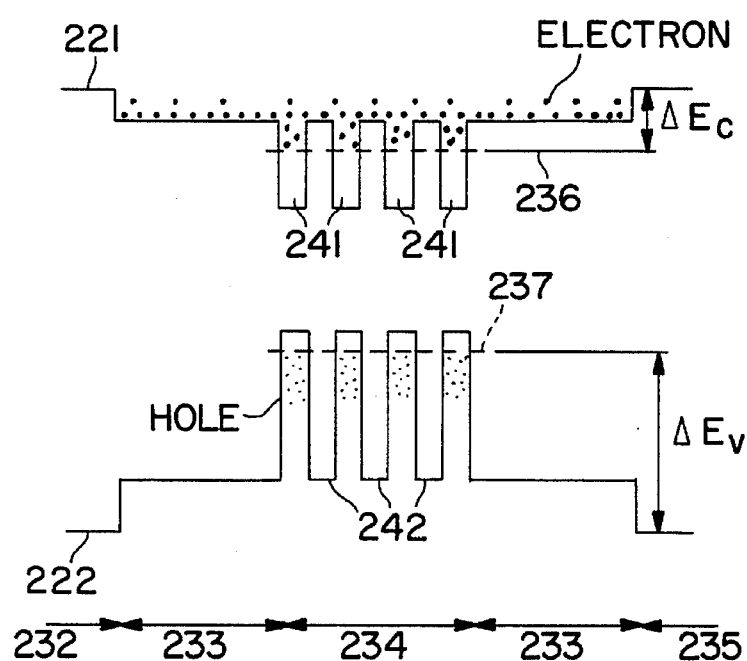
Figure 27:
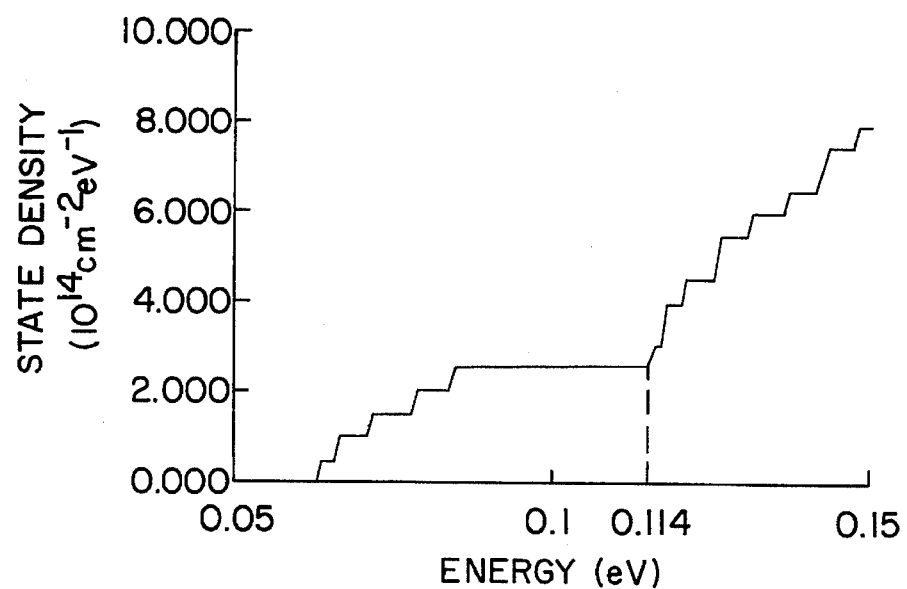
FIG. 27 is a drawing illustrative of the 2-dimensional state density of electrons of the multi-quantum wells of the prior art.

FIG. 25 shows the relationship of the injected current density and maximum gain. It can be seen that the current density required to obtain the same gain is greatly reduced in the invention, as described above. When this structure is used in the active layer of the laser, assuming 200 cm$^{-1}$ for the threshold gain of laser emission, the threshold current can be decreased by about 50% from the value in the prior art. Naturally, temperature dependence of the threshold current can also be reduced, making it possible to obtain a short wavelength semiconductor laser device having high reliability. Thus the invention is very effective in obtaining high performance of short wavelength multi-quantum well semiconductor laser device which has been difficult with the prior art.

The characteristics of a semiconductor laser device having single multi-quantum well structure can also be improved similarly to the case of a semiconductor laser device having a multi-quantum well structure, by inserting an out-barrier layer 212a having an energy band gap greater than the energy band gap of the optical guide layers between the quantum well layer and the optical guide layers.

EXAMPLE 6

Another semiconductor laser device of the invention will be described below. Structure of this semiconductor laser device is basically the same as that of the semiconductor laser devices shown in FIG. 21 and FIG. 22, while the structure of the part from the upper optical guide layer 203 to the multi-quantum well layer 204 and to the lower optical guide layer 203 which is provided between the p-cladding layer 205 and the n-cladding layer 202 is different.

FIG. 23A through 23D show the energy band diagrams of this part.

Figure 23A:
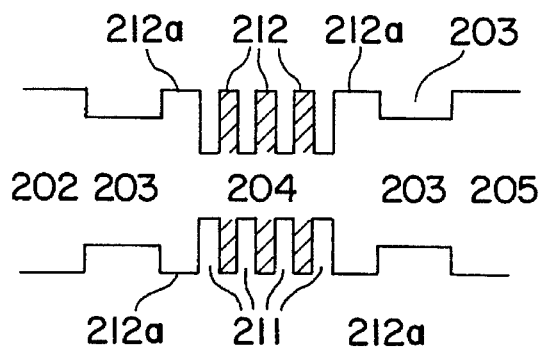
FIGS. 23A through 23D are drawings illustrative of the energy band of the multi-quantum wells of the semiconductor laser devices of the invention.
Figure 23B:
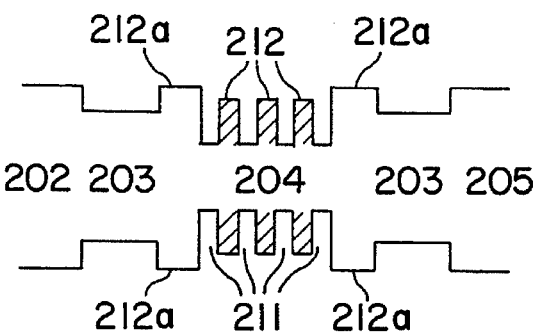
Figure 23C:
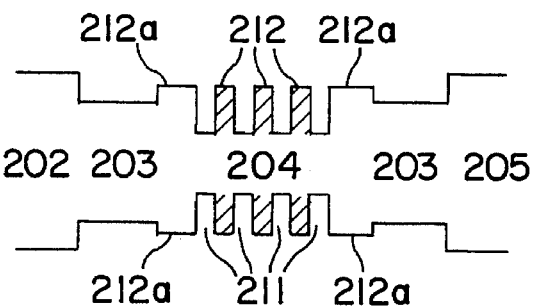
Figure 23D:
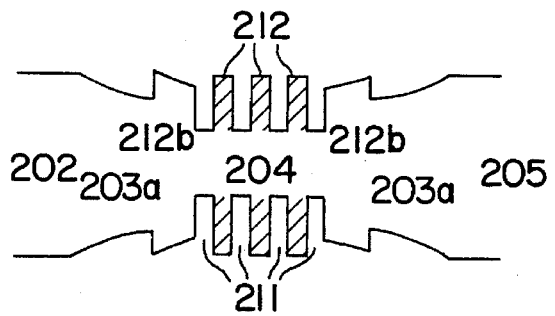

FIG. 23A is a band diagram of the structure described previously, which is shown for reference. FIG. 23B through 23D show the energy band structures of other examples of the invention.

The structure shown in FIG. 23B is different from the structure of FIG. 23A in that the energy band gap of the barrier layers 212 is relatively small. Even when the energy band gap of the barrier layers 212 is smaller than that of the out-barrier layers 212a, electrons which contribute to the laser emission can be effectively confined within the well layers 211 provided that the energy band gap of the barrier layers 212 is greater than the energy band gap of the optical guide layer s203, thus the state density of electrons which do not contribute to the laser emission can be reduced. Also with the structure of FIG. 23B, the refractive index of the barrier layers 212 can be made lower than that of the out-barrier layer 212a, and it is possible to confine the light effectively within the multi-quantum well.

In the structure of FIG. 23C, an energy band gap of the out-barrier layer 212a is made relatively smaller to the same value of the barrier layers 212 in contrast to the structure of FIG. 23B. With such a constitution, the refractive index can be further increased than in the case of the structure of FIG. 23B.

Difference between the structure of FIG. 23D and those of FIGS. 23A through 23C is that graded layers are used for the optical guide layer 203 and the barrier layer 212b. Composition of the optical guide layer of FIG. 23D changes gradually from $(Al_{0.7}Ga_{0.3})_{0.51}In_{0.49}P$ at the cladding layer side to $(Al_{0.4}Ga_{0.6})_{0.51}In_{0.49}P$. Composition of the out-barrier layer changes gradually from $(Al_{0.7}Ga_{0.3})_{0.51}In_{0.49}P$ at the optical guide layer side to $(Al_{0.6}Ga_{0.4})_{0.51}In_{0.49}P$.

Although FIGS. 23A through 23B show variations of laser structure obtained from the basic structure of FIG. 23A, the invention is not limited to these structures and can be embodied in combinations of the structures of FIGS. 23A through 23D. For example, the structure of FIGS. 23A and the structure of FIG. 23D may be combined. In this case, such a construction can be obtained where only the optical guide layers have a graded structure and the out-barrier layers comprise $(Al_{0.7}Ga_{0.3})_{0.51}In_{0.49}P$. By combining the structure of FIG. 23B and the structure of FIG. 23C, such a construction can be obtained as the energy band gap of the barrier layers 212 is smaller than energy band gap of the out-barrier layers 212a and the energy band gap of the out-barrier layer 212a is smaller than energy band gap of the cladding layer 202. Similar effects as those of the above examples can be obtained also with semiconductor laser devices obtained through these combinations.

EXAMPLE 7

Figure 28A:
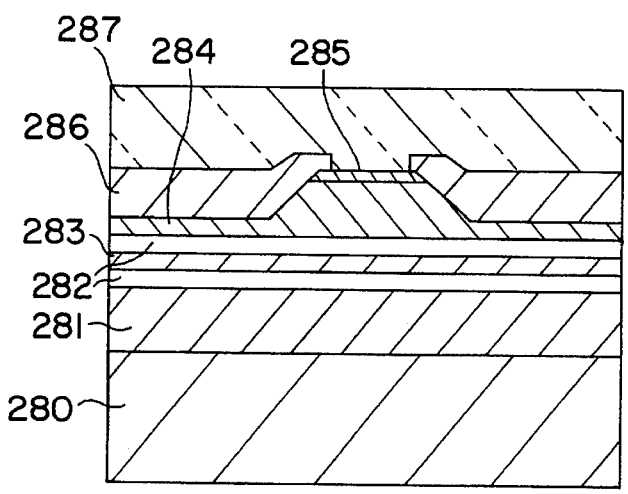
FIG. 28A is a cross sectional drawing illustrative of the structure of the semiconductor laser device of the invention.
Figure 28B:
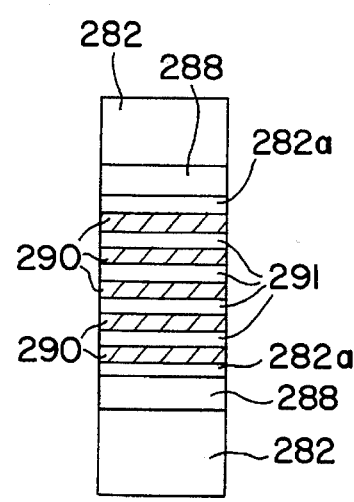
FIG. 28B is a cross sectional drawing illustrative of the detailed structure of the multi-quantum wells of the invention.

FIGS. 28A and 28B show cross sectional views of another multi-quantum well semiconductor laser device of the invention. Its basic structure is the same an the structure of the semiconductor laser device shown in FIGS. 21A and 21B (fifth example). Difference from the fifth example is that a high barrier section 288 which is a region of a wider energy band gap is formed in the optical guide layers 282 and that the energy band gap of the barrier layers 291 in the multi-quantum well layer 283 is made smaller. This semiconductor laser device can also be manufactured with the same manufacturing method of the fifth example.

As shown in FIGS. 28A and 28B, high barrier sections 288 are formed inside the optical guide layers 282. Because these layers prevent electrons which do not contribute to the laser emission from overflowing onto the multi-quantum well layer 283 similarly to the fifth example. This makes it possible to confine only the electrons which contribute to the laser emission within the multi-quantum well layer 283, thus a semiconductor laser device having a low threshold current can be obtained.

In the multi-quantum well layers 283, the well layers 290 comprise $Ga_{0.44}In_{0.56}P$ which is 3 nm thick, and the barrier layers 291 comprise $(Al_{0.5}Ga_{0.5})_{0.51}In_{0.49}P$ which is 5 nm thick. The optical guide layers 282 include the high barrier sections 288, which have wider energy band gaps than the optical guide layers 282, in a part thereof. The high barrier sections 288 have a thickness of 20 nm. Compressive strain of 0.5% is applied to the quantum well layers 290.

Figure 29:
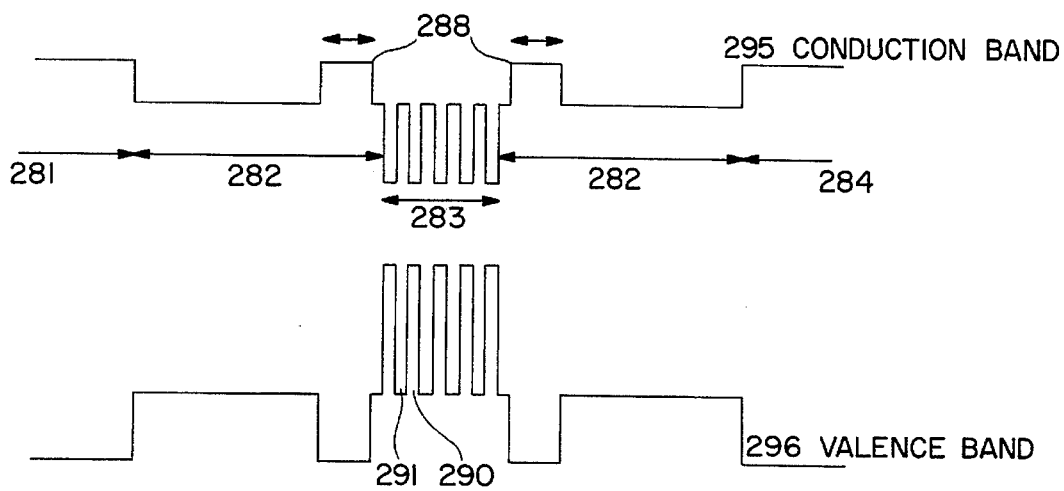
FIG. 29 is a drawing illustrative of the energy band of the multi-quantum wells of the semiconductor laser device of the invention.

The structure of the invention will be described below in more detail with reference to FIG. 29. FIG. 29 shows the band structure of the semiconductor laser device of the invention.

As can be seen from FIG. 29, the high barrier layer provided in the optical guide layer 282 is made of the same material as that of the p-and n-cladding layers 281, 284, and the high barrier layer 288 has wider energy band gap than the optical guide layers 282.

Multiple quantum wells of such a structure increase the intervals of sub bands beyond the energy of the barrier layers 291, and consequently decrease the state density both in the conduction band and in the valence band.

In this example, the thickness of the part of the optical guide layer 282 minus the high barrier section 288 is preferably greater than the thickness of the multi-quantum well layer 283. In this way, electrons having energy above the conduction band of the optical guide layers 282 can be localized in the optical guide layers 282, not in the multi-quantum well layer, and effects similar to the effects of the fifth example can be obtained.

Figure 30:
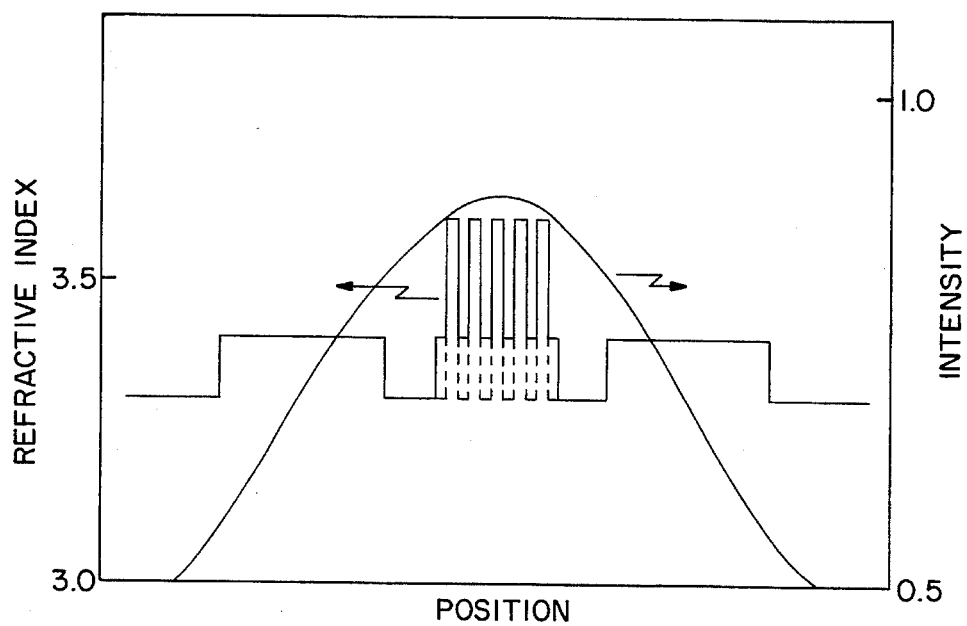
FIG. 30 is a drawing illustrative of the refractive index and the light intensity distribution of the multi-quantum wells of the invention.

FIG. 30 shows the distribution of the refractive index and the distribution of light intensity in this structure. In FIG. 30, the refractive index of the semiconductor laser device of this example is represented by a solid line and the refractive index of the semiconductor laser device of the fifth example is represented by a dashed line. Thus, because the refractive index has a peak value around the quantum well, confinement of light is enhanced and the combination of the optical gain generated in the quantum well and the optical mode becomes stronger. As a result the emission threshold can be reached with a carrier density comparable to that of the fifth example.

Because the multi-quantum well of this example has lower quasi Fermi level with the same carrier density in accordance to the higher state density, current generated by emission recombination of the carriers near the band edge decreases.

Figure 31:
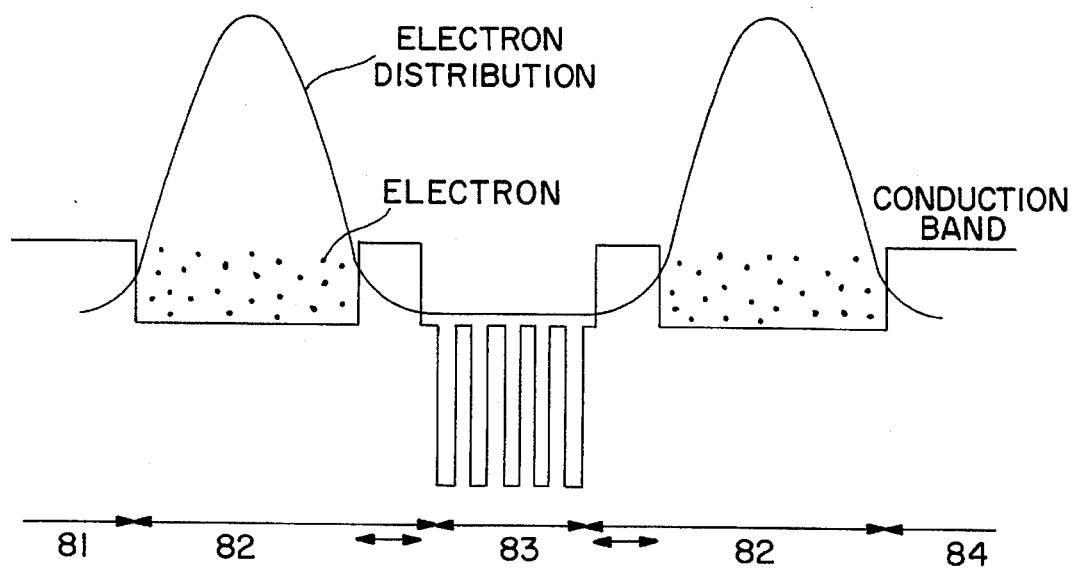
FIG. 31 is a drawing illustrative of the electron distribution in the conduction band of the multi-quantum wells of the invention.

In the semiconductor laser device of this example, densities of states of the carriers (electrons and holes) having an energy higher than the barrier layers 291 or the optical guide layers 282 show steep increase as the energy increases. However, as will be obvious from the distribution function of carrier shown in FIG. 31, carriers in such a high energy region hardly exist near the quantum well due to the high barrier effect similar to the fifth example, and are confined within the optical guide layer. Thus electrons which do not contribute to the laser emission are confined within the optical guide layers and do not overflow the multi-quantum well, thereby making it possible to suppress the recombination current which does not contribute to the emission in the multi-quantum well.

Although both the conduction band and the valence band show similar distributions, because the barrier is higher in the valence band and the state density is also greater in the valence band, electrons abound in this energy region but holes are confined within the multi-quantum well layer and hardly exist in the optical guide layer. Therefore electrons which abound in the optical guide layer cannot recombine with the holes which exist in the optical guide layer, and ineffective current which does not contribute to the laser emission does not flow.

As described above, the semiconductor laser device of the invention is capable of changing the spatial distribution and the energy distribution of the carriers in the entire active region including the optical guide layer, and thereby greatly reducing the recombination current during laser emission.

Also because the quasi Fermi level of the conduction band during laser emission can be decreased, leak current which flows due to the diffusion of the carrier into the p-cladding layer can be suppressed, thus the low threshold current for the laser emission, operation at higher temperatures and higher reliability can be obtained.

Although a short wavelength semiconductor laser device employing GaInP/AlGaInP material is described in this example, similar effects can be obtained with other materials. Also this example is described in the case where symmetric optical guide layers are placed on both sides of the quantum well, although the optical guide layers may be asymmetrical or may exist only of the side where the p-cladding layer 284 exists.

Characteristics of a semiconductor laser device having single quantum well structure can also be improved similarly to the case of the semiconductor laser device with multi-quantum well structure, by inserting the out-barrier layer 212a having wider energy band gap than the optical guide layer between the multi-quantum well layer and the optical guide layer.

EXAMPLE 8

Figure 32A:
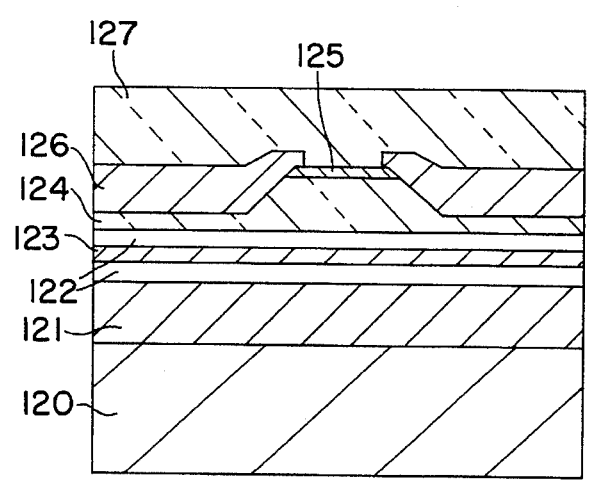
FIG. 32A is a cross sectional drawing illustrative of the structure of the semiconductor laser device of the invention.
Figure 32B:
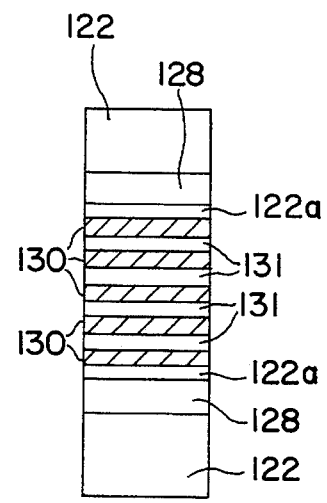
FIG. 32B is a cross sectional drawing illustrative of the detailed structure of the multi-quantum wells of the invention.

FIGS. 32A and 32B show cross section of the device structure of still another semiconductor laser device of the invention. Its basic structure is the same as the structure of the semiconductor laser device shown in FIGS. 21A and 21B (fifth example). Differences from the fifth example are that low barrier sections 128 which are a region of narrower energy band gap are formed in the optical guide layers 122 and that the energy band gap of the barrier layers 131 in the multi-quantum well layer 123 is made smaller. This semiconductor laser device can also be manufactured with the same manufacturing method of the fifth example.

Because electrons which do not contribute to the laser emission can be confined within the low barrier sections 128 by providing the low barrier sections 128 having narrower energy band gap in the optical guide layers 122, the recombination current which does not contribute to the emission in the multi-quantum well layer can be suppressed.

In the multi-quantum well layer 123, the well layers 130 comprise $Ga_{0.44}In_{0.56}P$ which is 3 nm thick, and the barrier layers 131 comprise $(Al_{0.5}Ga_{0.5})_{0.51}In_{0.49}P$ which is 5 nm thick. The low barrier sections 128 in the optical guide layers 122 have a thickness of 30 nm. A compressive strain of 0.5% is applied to the quantum well layers 130.

Figure 33:
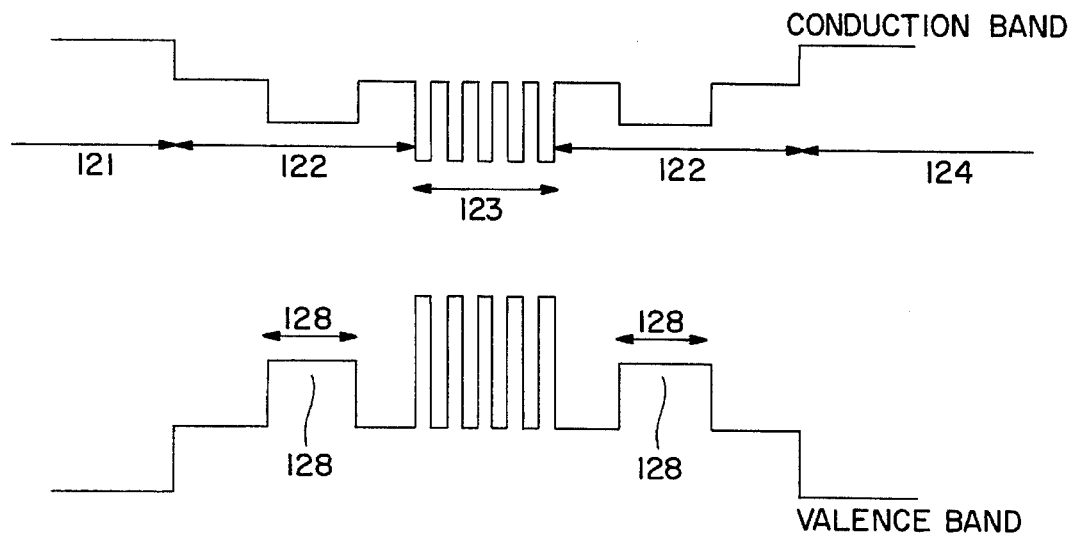
FIG. 33 is a drawing illustrative of the energy band of the multi-quantum wells of the invention.
Figure 34:
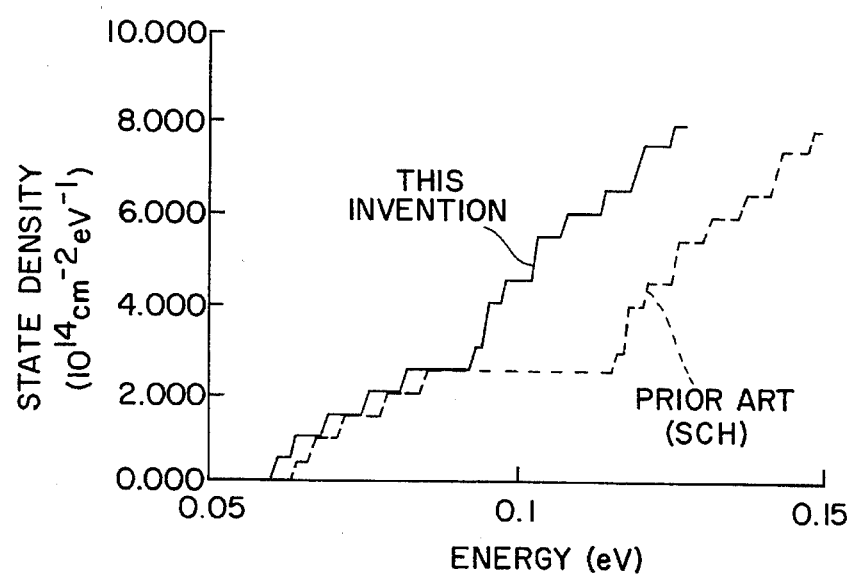
FIG. 34 is a drawing illustrative of the state density of electrons of the multi-quantum wells of the invention.

FIG. 33 shows the band structure of the multi-quantum well semiconductor laser device. The low barrier layers 128 have an energy band gap smaller than that of the optical guide layer 122 and the barrier layer 131, higher than the ground level of electron in the quantum well by only 30 meV, for example, in the conduction band. Consequently, the state density in the conduction band increases at a lower energy than in the separate confinement type multi-quantum well structure (SCH structure) of the prior art where no low barrier section is provided as shown in FIG. 34. Although the state density increases steeply beyond a certain energy similarly in the valence band, this has no significant effect on the energy distribution of holes because this region is at a sufficient distance from the band edge. Therefore the quasi Fermi level of the conduction band increases only slightly even when the carrier density increases, thereby requiring a high carrier density to obtain a given maximum gain.

Figure 35:
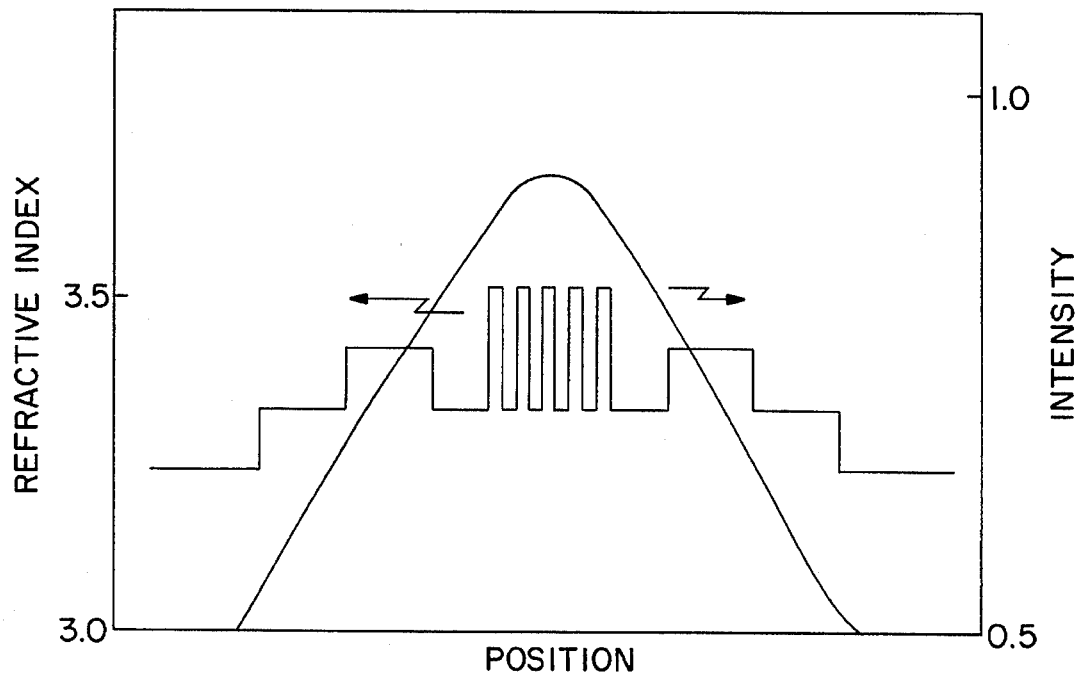
FIG. 35 is a drawing illustrative of the refractive index and the light intensity distribution of the multi-quantum wells of the invention.

However, because the refractive index increases around the quantum wells as shown in FIG. 35, confinement of light is enhanced and the combination of the optical gain generated in the quantum well and the optical mode becomes stronger. As a result, the emission threshold can be reached with a carrier density comparable to that of the SCH structure of the prior art.

Figure 36:
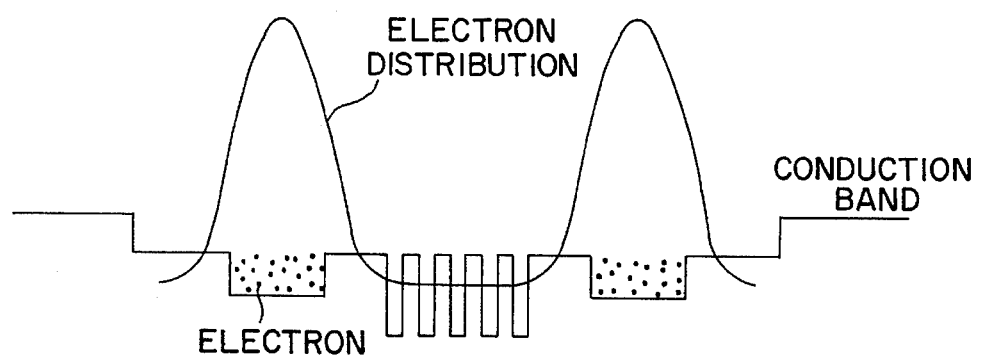
FIG. 36 is a drawing illustrative of the electron distribution in the conduction band of the multi-quantum wells of the invention.

Also, because the multi-quantum well of the invention has a lower quasi Fermi level with the same carrier density in accordance to the higher state density, the current generated by emission recombination of the carriers near the band edge decreases. Although electrons having high energy in the conduction band are confined in the potential well of the low barrier section as shown in FIG. 36, they do not flow as an ineffective current because there are almost no holes in this region. Therefore the threshold current can be reached with less current even when the carrier density increases. Also, because the quasi Fermi level of the conduction band can be decreased, leak current can also be suppressed, thus low threshold current for the laser emission, operation at a higher temperatures and higher reliability can be obtained.

In this example, the thickness of the low barrier section is preferably greater than the thickness of the multi-quantum well layer.

Although short wavelength semiconductor laser devices employing GaInP/AlGaInP materials are described in the fifth through eighth examples, similar effects can be obtained with other materials. Also, a semiconductor laser device having symmetric optical guide layers placed on both sides of the quantum well has been described, although the optical guide layers may be asymmetrical or may exist only on the side of the cladding layer.

Characteristics of a semiconductor laser device having single quantum well structure can also be improved similarly to the case where the semiconductor laser device of a multi-quantum well structure, by inserting a high barrier section having a wider energy band gap or the low barrier section having a narrower energy band gap than the optical guide layer in the optical guide layer.

Figure 37A:
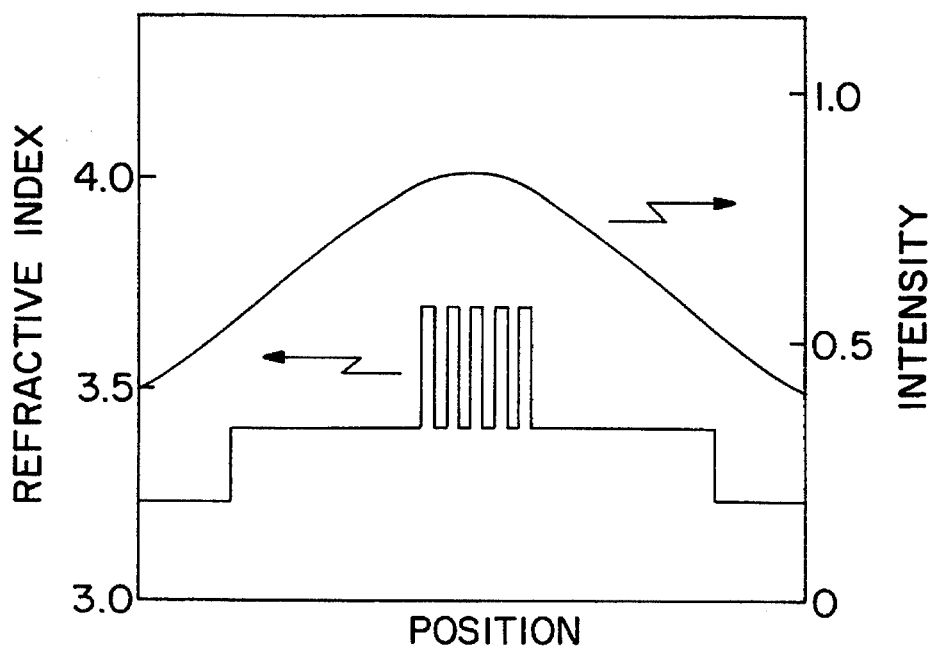
FIG. 37A is a drawing illustrative of the energy band of the semiconductor laser device of the SCH structure of the prior art.
Figure 37B:
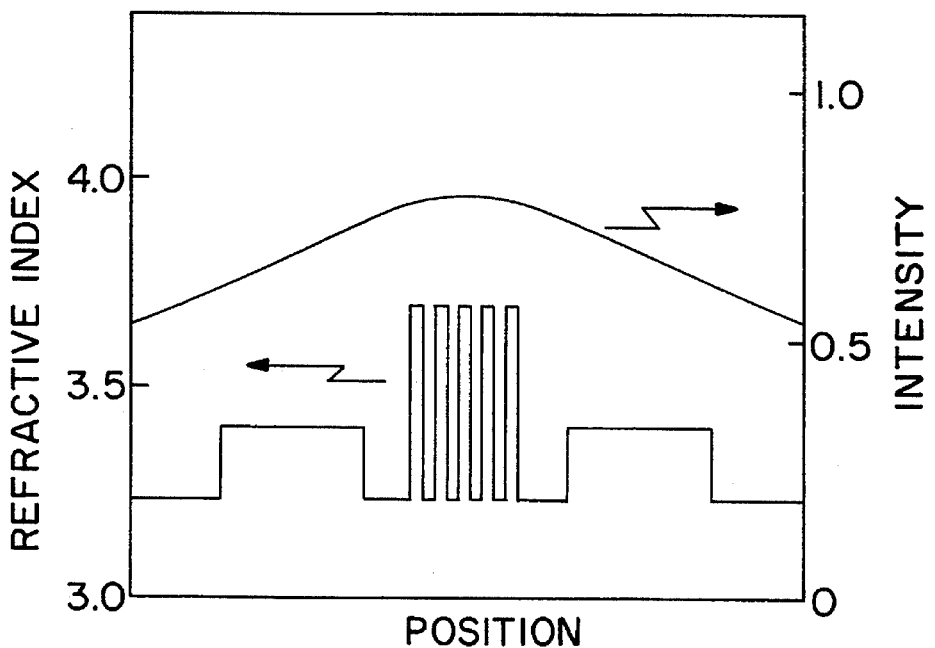
FIG. 37B is a drawing illustrative of the energy band of the fifth example of the semiconductor laser device of the invention.

Now the SCH structure of the prior art and the fifth example will be compared below. FIG. 37A shows a typical separate confinement type multi-quantum well (SCH-MQW) structure operating in the 630 nm band. FIG. 37B shows the energy band diagram of the high barrier type structure of the fifth example. Either of these structures has an optical guide layer 233 wherein light is confined. This enables the light emitted in the quantum well to effectively contribute to the induced emission and reduces the threshold current for the laser emission. Because the carrier density during laser emission decreases, leak current can also be decreased.

However, height difference between the quasi Fermi Level of the conduction band 221 and the band edge of the cladding layer still remains small. This means that the confinement of carriers within the active region is weak, which leads to diffusion of a number of electrons into the p-cladding layer resulting in a leak current. Therefore such problems occur as increase in the current required for the laser emission and heavy dependence of the current on the temperature, specially in the band structure of FIG. 37A.

In the band structure of FIG. 37B, the barrier layer 212 and the out-barrier layer 212a are made of the same material as the cladding layers 202, 205, amid the energy band gap is greater than that of the optical guide layer 203. Multi-quantum well of such a constitution increases the potential barrier height due to the barrier layer 212 and the out-barrier layer 212a, and increases the effect of confining the carriers within the well layer 11. This results in decreased state density both in the conduction band and in the valence band, making it possible to obtain a high gain with a low carrier density.

Figure 38A:
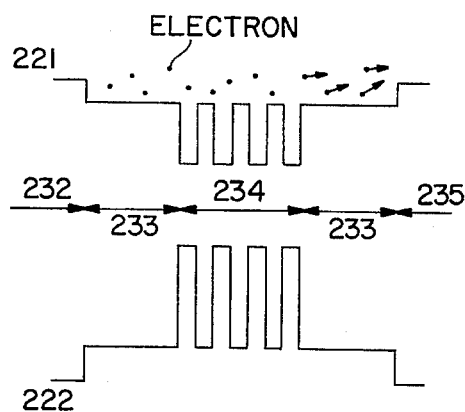
FIG. 38A is a drawing illustrative of the electron distribution of the semiconductor laser device of the SCH structure of the prior art.
Figure 38B:
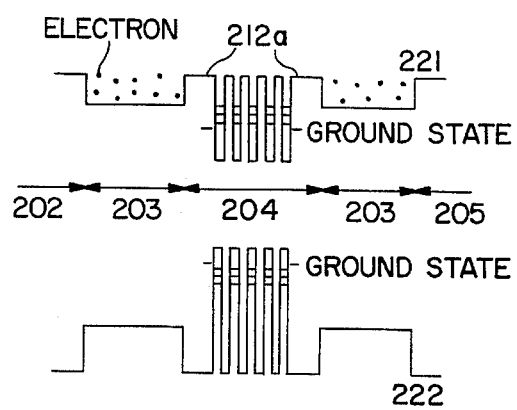
FIG. 38B is a drawing illustrative of the electron distribution in the fifth example of the semiconductor laser device.

FIGS. 38A and 38B correspond to FIGS. 37A and 37B, illustrating the spatial distribution of electrons in the higher energy region of the optical guide layer 203. As shown in FIG. 38A, electrons also exist also near the multi-quantum well at the center in the SCH structure of the prior art. In contrast, most of the electrons are distributed in the optical guide layer 203 in the case of the high barrier type structure of the fifth example as shown in FIG. 38B.

Holes show similar spatial distribution, though holes cannot exist in the optical guide layer 203 for the reason of energy in either structure. Therefore, the proportion of electrons existing near the band edge which can contribute to the laser emission is higher in the high barrier type structure of the fifth example with the same electron density, thereby higher gain can be obtained. However, stronger carrier confinement can be obtained by making the thickness of the out-barrier layer 212a thicker than the de Broglie wavelength.

Figure 39A:
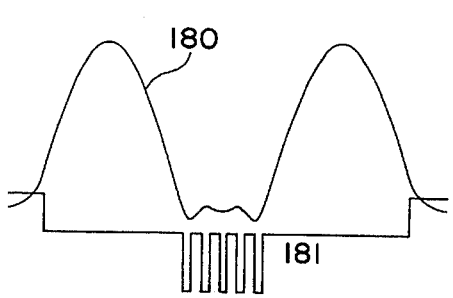
FIG. 39A is a drawing illustrative of the refractive index and the light intensity distribution of the semiconductor laser device of SCH structure of the prior art.
Figure 39B:
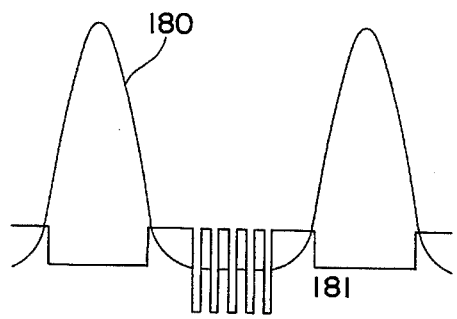
FIG. 39B is a drawing illustrative of the refractive index and the light intensity distribution in the fifth example of the semiconductor laser device of the invention.
Figure 41A:
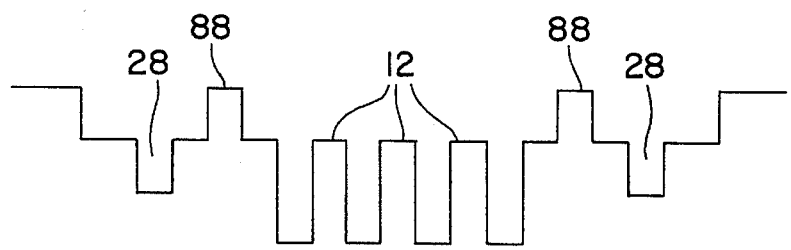
FIGS. 41A and 41B are the energy band diagrams of the semiconductor laser devices of the present invention.
Figure 41A:
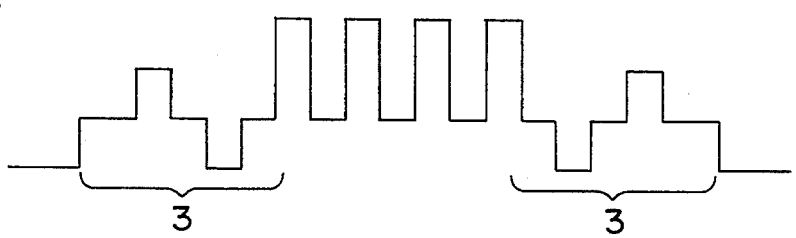
Figure 41B:
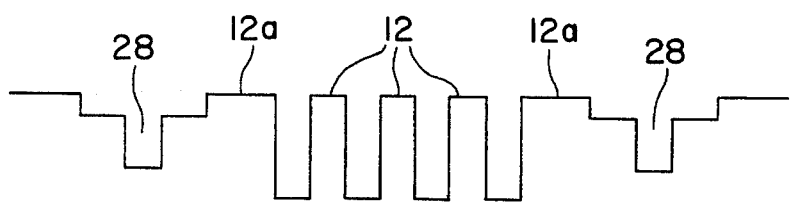
Figure 41B:
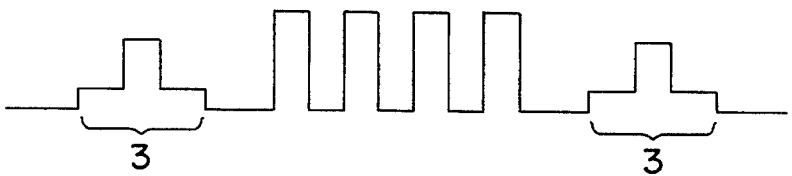

FIGS. 39A and 39B show the refractive index and the light intensity distribution of the semiconductor laser device of a SCH structure of the prior art and the high barrier type multi-quantum wells of the fifth example.

FIGS. 40A through 40D and FIGS. 41A and 41B show the energy band diagrams of semiconductor laser devices according to the present invention. These semiconductor laser devices include modified features of the fifth to eighth examples of the invention.

The semiconductor laser devices as shown in FIGS. 40A and 40B are modifications of the seventh example of the semiconductor laser device of the invention in which the energy band gap of the optical guide layer 3 is larger than that of the barrier layer 12. In the semiconductor laser device of FIG. 40B, the energy band gap of the high barrier section 88 is set to be equal to that of the cladding layer 2.

The semiconductor laser devices of FIGS. 40C and 40D are modifications of the eighth example of the semiconductor laser device of the invention in which the energy band gap of the optical guide layer 3 is larger than that of the barrier layer 12. As is shown in FIG. 40D, the semiconductor laser device may be designed so that the energy band gap of the optical guide layer 3 at both sides of the low barrier section is different. Further, the optical guide layers 3 may have a graded refractive index structure. The semiconductor laser device of FIG. 41A includes both the high barrier section 88 and the low barrier section 28 formed in the optical guide layers 3. The semiconductor laser device of FIG. 41B includes both the out-barrier layer 212a and the low barrier section 28.

What is claimed is:

1. A semiconductor laser device comprising:

a quantum well layer including a well layer and a barrier layer for light emission; and an optical guide layer to confine light generated in the quantum well layer within the quantum well layer, the optical guide layer including an electron distribution control layer which has an energy band gap of a magnitude different from an energy band gap of the optical guide layer and thereby controls the distribution of electrons in the optical guide layer and the quantum well layer, wherein the electron distribution control layer includes a high barrier layer which has energy band gap greater than an energy band gap of the optical guide layer, and a thickness of the high barrier layer is greater than the de Broglie wavelength of an electron.

2. A semiconductor laser device comprising:

a quantum well layer including a well layer and a barrier layer for light emission; and an optical guide layer to confine light generated in the quantum well layer within the quantum well layer, the optical guide layer including an electron distribution control layer which has an energy band gap of a magnitude different from an energy band gap of the optical guide layer and thereby controls the distribution of electrons in the optical guide layer and the quantum well layer, wherein the electron distribution control layer includes a low barrier layer which has an energy band gap smaller than an energy band gap of the optical guide layer, and a thickness of the low barrier layer is greater than the de Broglie wavelength of an electron.

3. The semiconductor laser device of claim 1, wherein thickness of the optical guide layer except for the electron distribution control layer is greater than a thickness of the quantum well layer.

4. The semiconductor laser device of claim 2, wherein a thickness of the optical guide layer is greater than a thickness of the quantum well layer.

5. The semiconductor laser device of claim 2, wherein a thickness of the low barrier layer of the electron distribution control layer is greater than the thickness of the quantum well layer.

\* \* \* \* \*

UNITED STATES PATENT AND TRADE MARK OFFICE
CERTIFICATE OF CORRECTION

PATENT NO.   : 5,502,739
DATED        : March 26, 1996
INVENTOR(S)  : Kidoguchi et al.

It is certified that error appears in the above-identified patent and that said Letters Patent is hereby corrected as shown below:

On the Cover Page, item [56] References Cited, add the following references:

5,386,429    1/1995    Naito et al.

57-5684A1    12/1993   Europe 60-279829    11/1987   Japan

Signed and Sealed this

Seventeenth Day of September, 1996

Attest:

BRUCE LEHMAN

*Attesting Officer*                *Commissioner of Patents and Trademarks*